United States Patent
Kim et al.

(10) Patent No.: US 6,721,908 B1
(45) Date of Patent: Apr. 13, 2004

(54) INTERLEAVING/DEINTERLEAVING APPARATUS AND METHOD FOR A COMMUNICATION SYSTEM

(75) Inventors: Min-Goo Kim, Suwon-shi (KR); Beong-Jo Kim, Songnam-shi (KR); Young-Hwan Lee, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/541,816

(22) Filed: Apr. 3, 2000

(30) Foreign Application Priority Data

Apr. 2, 1999 (KR) ......... 1999-12858
Apr. 6, 1999 (KR) ......... 1999-11798

(51) Int. Cl.$^7$ ............ G11C 29/00
(52) U.S. Cl. ............ 714/702
(58) Field of Search ........ 714/701, 702, 714/755, 757, 761, 786, 787, 788, 795; 711/5, 203, 217

(56) References Cited

U.S. PATENT DOCUMENTS

| | | | |
|---|---|---|---|
| 5,446,747 A | | 8/1995 | Berrou |
| 6,138,262 A | * | 10/2000 | Baek ............ 714/768 |
| 6,314,534 B1 | * | 11/2001 | Agrawal et al. ...... 714/702 |
| 6,334,197 B1 | * | 12/2001 | Eroz et al. .......... 714/701 |
| 6,353,900 B1 | * | 3/2002 | Sindhushayana et al. ... 714/701 |
| 6,381,728 B1 | * | 4/2002 | Kang ............ 714/781 |

FOREIGN PATENT DOCUMENTS

JP 9-102748 4/1997

OTHER PUBLICATIONS

Japanese Office Action dated Sep. 17, 2002 issued in a counterpart application, namely, Appln. No. 2000-610133.

* cited by examiner

*Primary Examiner*—Albert Decady
*Assistant Examiner*—Matthew C. Dooley
(74) *Attorney, Agent, or Firm*—Dilworth & Barrese, LLP

(57) ABSTRACT

A device for generating L addresses, which are smaller in number than $2^m \times N_g$ virtual addresses, for reading data from an interleaver memory in which L data bits are stored, the device including: $N_g$ PN generators each including m memories; an address generator for adding an offset value to the input data size to provide a virtual address having a size of a multiple of $2^m$, and generating addresses other than addresses corresponding to the offset value in address generation areas using the address generation areas having the size of $2^m$; and means for reading the input data from the interleaver memory using the addresses generated from the address generation areas.

24 Claims, 14 Drawing Sheets

INTERLEAVING/DEINTERLEAVING APPARATUS AND METHOD FOR A COMMUNICATION SYSTEM

BACKGROUND OF THE INVENTION

1. Field of the Invention

The present invention relates generally to an interleaving/deinterleaving device and method, and in particular, to an interleaving/deinterleaving device and method for a turbo encoder used in radio communication systems such as satellite, ISDN (Integrated Services Digital Network), digital cellular, W-CDMA (Wideband Code Division Multiple Access), IMT-2000 and W-ATM (Wideband Asynchronous Transfer Mode) communication systems.

2. Description of the Related Art

A turbo code is a type of an error correction code which affects the reliability of a digital communication system. An existing turbo coder is divided into a serial turbo coder and a parallel turbo coder. A parallel turbo encoder encodes an input frame of L information bit streams into parity symbols using two simple parallel concatenated codes, wherein recursive systematic convolutional (RSC) encoders are typically used for component encoders. In addition, the parallel turbo encoder includes an interleaver connected between the component encoders.

In the turbo encoder, interleaving is performed to randomize data streams which are input from the component encoders on a frame unit basis and to improve the distance property of a codeword. In particular, it is expected that the turbo encoder will be used in a Supplemental Channel (or traffic channel) of an IMT-2000 (or CDMA-2000) communication system and in a data channel of UMTS (Universal Mobile Telecommunication System) proposed by ETSI (European Telecommunication Standards Institute). Thus, a method for employing an interleaver with a turbo encoder for this purpose is required.

FIG. 1 shows a common parallel turbo encoder, which is disclosed in detail in U.S. Pat. No. 5,446,747, issued on Aug. 29, 1995, which is hereby incorporated by reference.

Referring to FIG. 1, the turbo encoder includes a first component encoder 111 for encoding input frame data, an interleaver 112 for interleaving the input frame data, and a second component encoder 113 for encoding an output of the interleaver 112. A known RSC encoder or NSC (Non-Recursive Systematic Convolutional) encoder is typically used for the first and second component encoders 111 and 113. Such component encoders have different structure according to a coding rate, a constraint length K and a generator polynomial. Further, the interleaver 112 has the same size as the input information bit frame, and rearranges the sequence of the information bits provided to the second component encoder 113 to reduce the correlation between the information bits.

For the internal interleaver (or a turbo interleaver) 112 of the turbo encoder, various interleavers are proposed, such as PN (Pseudo Noise) random interleaver, random interleaver, block interleaver, non-linear interleaver, and S-random interleaver. However, so far, such interleavers are mere algorithms designed to improve their performances in terms of scientific theory rather than practice. When implementing an actual system, the hardware implementation complexity must be taken into consideration. A description will now be made of properties and problems associated with the conventional interleaver for the turbo encoder.

Performance of the turbo encoder is dependent upon the internal interleaver. In general, an increase in the input frame size (i.e., the number of information bits included in one frame) requires an increase in performance of the turbo encoder. However, an increase in interleaver size requires a geometric increase in calculations. Therefore, in general, it is not practical to implement the interleaver for a large frame size.

Generally speaking according to experiments, the random interleaver is superior in performance to the block interleaver. However, the random interleaver is disadvantageous in that an increase in the variety and size of the frame causes an increase in the required memory capacity for storing an interleaver index (i.e., mapping rule or address). That is, the memory capacity required for addressing greatly increases. Therefore, taking the required hardware size into consideration, it is preferable to employ an address enumeration method for reading data stored at a corresponding address by generating an address at every symbol clock using an index generating rule rather than a look-up table method for storing the interleaver index.

In conclusion, when various interleaver sizes are required and the hardware implementation complexity is limited, as in an IMT-2000 or UMTS system, the turbo interleaver should be designed to guarantee optimal interleaver performance by taking inherent limitations into consideration. That is, an interleaver which performs interleaving/deinterleaving according to a specific interleaving rule is required. In addition, the turbo interleaver requires good interleaver properties (e.g., distance property, weight property and random property).

A IMT-2000 or UMTS specification has not yet been given which provides any definition for the turbo interleaver. The forward link and the reverse link defined by the IMT-2000 specification have various types of logical channels and various interleaver sizes. Therefore, in order to meet this variety requirement, an increase in the memory capacity is required. For example, in a CDMA-2000 forward link transmission mode, the interleaver size can vary from 144 bits/frame to 36864 bits/frame.

To sum up, the prior art has the following disadvantages.

First, for the conventional internal interleaver of the turbo encoder, PN random interleavers, random interleavers, block interleavers, non-linear interleavers, and S-random interleavers may be used. However, such interleavers are mere algorithms designed to improve their performances in terms of scientific theory rather than practice. Therefore, when implementing an actual system, the hardware implementation complexity of such interleavers must be considered. However, this is not specifically defined.

Second, since a controller (CPU or host) of the transceiver must store interleaving rules according to the respective interleaver sizes in the existing interleaving method using a look-up table, a host memory requires a separate capacity in addition to an interleaver buffer. That is, when the frame size is varied, and increases in size, an increased memory capacity for storing the interleaver index (i.e., mapping rule or address) is required.

Third, it is not easy to implement an interleaver satisfying both the distance property and the random property.

SUMMARY OF THE INVENTION

It is, therefore, an object of the present invention to provide an interleaving/deinterleaving device and method which satisfies distance property, weight property and random property of a turbo encoder in a communication system.

It is another object of the present invention to provide a device and method for performing interleaving using a virtual address area having a size $2^m \times N_g$ determined by adding a specific value to an input data size in a communication system.

It is yet another object of the present invention to provide an interleaving device and method which prevents generation of invalid addresses caused by a specific value added to an input data size to perform interleaving.

It is yet another object of the present invention to provide a method for determining an optimal initial value of a PN sequence generator which generates a random address component according to an address area of an internal interleaver in a turbo encoder.

To achieve the above object, there is provided a device for generating L addresses, which are smaller in number than $2^m \times N_g$ virtual addresses, for reading data from an interleaver memory in which L data bits are stored. The device comprises a selection circuit including $N_g$ PN (Pseudo Noise) generators each including m memories, wherein one of the PN generators generates (OSV-1) offset values (OSV) satisfying $OSV = 2^m \times N_g - L$ and $(2^m - OSV)$ non-zero states in response to a first clock signal and the other PN generators each generate $(2^m - 1)$ non-zero states, wherein the selection circuit selects the PN generators according to a predetermined order in response to a select signal and outputs a state generated from the selected PN generator; means for detecting each offset state from one PN generator, providing said select signal for not selecting said one PN generator so that the detected offset state is not output, and generating high address bits related to each selection of the PN generators in response to clock pulses of a second clock signal having a shorter period than the first clock signal; means for generating low address bits determined by subtracting one from each state output from the selection circuit when a number of selection periods of the PN generators is smaller than $2^m$, and generating low address bits corresponding to $2^m - 1$ when the number of selection periods is $2^m$; and an address buffer for storing the addresses, said L addresses each being comprised of the high address bits and the low address bits.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
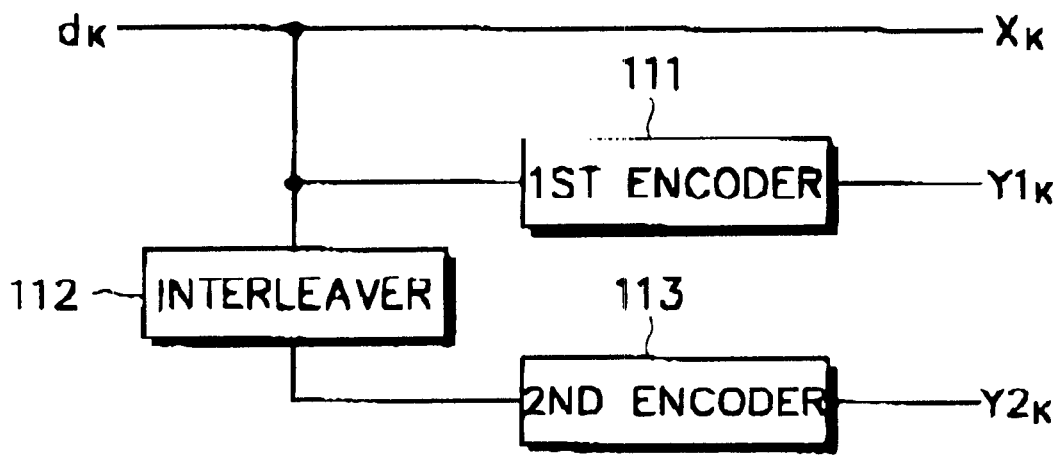
FIG. 1 is a block diagram illustrating a conventional turbo encoder.

A preferred embodiment of the present invention will be described herein below with reference to the accompanying drawings. In the following description, well-known functions or constructions are not described in detail to avoid obscuring the invention in unnecessary detail.

To design a turbo encoder which has optimal performance with respect to various frame sizes, many parameters must be considered, such as the amount of memory for the component encoders of the turbo encoder (i.e., constraint length K), a plurality of generator polynomials and an optimal code rate. It is very difficult to design a turbo encoder which has optimal performance through experiments if it is not verified how such parameters(generator polynomials and an optimal code rate, etc) affect the performance.

Therefore, in general, interleavers are implemented by determining conditions satisfying several given criteria. The criteria are as follows:

Distance Property: The distance between adjacent codeword symbols should be maintained to a certain extent. Since this has the same function as a codeword distance property of a convolutional code, it is preferable that the interleaver be designed to have a longer distance, if possible.

Weight Property: The weight of a codeword corresponding to a non-zero information word should be higher than a threshold value. Since this has the same function as the minimum distance property of the convolutional code, it is preferable that the interleaver should be designed to have a greater weight, if possible.

Random Property : The correlation factor between output word symbols after interleaving should be much lower than the correlation factor between original input word symbols before interleaving. That is, randomization between the output word symbols should be completely performed. This makes a direct effect on the quality of extrinsic information generated in continuous decoding.

A description of the invention will now be described hereinbelow with reference to the accompanying drawings.

The invention proposes an optimal interleaving/deinterleaving device satisfying properties (including distance property, weight property and random property) of the turbo interleaver.

Generally, in the turbo encoder, a random interleaver has good performance, especially with larger frame sizes. It is therefore preferable to design an interleaver such that the complexity is decreased while incorporating the performance of a random interleaver. To this end, an embodiment of the present invention employs a linear feedback shift register (LFSR) for generating a PN sequence and uses a random number generated therefrom as an address. However, when using this method, the following problems should be considered.

First, the PN sequence has a period of $2^m-1$.

Second, the turbo code is processed on an input frame size unit basis. However, most frame sizes cannot be expressed in terms of a power of 2.

To solve this problem, a proposed address generator for the turbo interleaver adds a minimum value (hereinafter, referred to as an offset value (OSV)) to the frame size L to make a virtual interleaving size N=L+OSV become a multiple of $2^m$, when the size L of the frame data to be interleaved cannot be expressed in terms of a power of 2. Here, the offset value is added to the frame size such that the number of consecutive '0' bits from the least significant bit (LSB) is at least one when the frame size is converted to a binary value. Then, combinations of a group number $N_g$ and a value 'm' are calculated, which satisfy a virtual frame size N of $N_g \times 2^m$. For the respective combinations, PN addresses are generated according to an area of size $2^m$ and then selected sequentially or randomly to interleave the whole input frame. Here, the group number $N_g$ and the value 'm' are determined through computer simulation and a search algorithm (described below) to optimally satisfy the interleaver properties.

For example, a description will be made regarding a method for determining the offset value when the frame size is 376 (=101111000). The frame size is converted to a binary value 101111000 (=376), and then an offset value is added to the frame size such that the number of consecutive zero (0) bits from the LSB becomes at least 1. Herein, the offset value can be 8 (=1000), for example. Therefore, the virtual interleaving size (or virtual frame size) is 384. When the interleaving addresses are generated for the virtual interleaving size, additional unnecessary read addresses are generated for each address added by the added offset value. Such unnecessary addresses are called "invalid address". If the offset value is added to the input data size value such that the input frame should be expressed in terms of a power of 2, the virtual interleaving size becomes 512 and the offset value becomes 136. An increase in a size 4600 input frame requires an offset value of 3592 to reach $2^{14}$=8192, thereby making it difficult to process 3592 invalid addresses. Therefore, a proper offset value is added such that the virtual interleaving size should be $2^m \times N_g$. Further, it is necessary to properly divide the group number $N_g$. However, an increase in the group number may cause deterioration in the random property of the codewords. In addition, since a great decrease in the group number causes an increase in the area size, the memory capacity for storing the interleaving index (i.e., mapping rule or address) is increased. Therefore, the proper values are determined through simulations.

A turbo interleaver according to the present invention permutes the sequence of the input information bits by offset controlled PN interleaving, and provides the permuted information bits to the second component encoder. Therefore, the interleaver according to the present invention includes an input/output data buffer for storing input information bits, and an offset controlled PN interleaving block (comprised of a partial reversal interleaver plus a comparator) which divides the virtual interleaver size determined by adding the offset value to the input data size into several areas to generate random addresses according to the respective areas, and then sequentially or randomly selects the generated random addresses to generate interleaved addresses. In addition, for the first and second component encoders, the turbo encoder can use not only the conventional component encoder, but also a component encoder specified by the CDMA-2000 system and a component encoder specified by the UMTS system. Further, the interleaver according to the present invention can be applied to not only an internal interleaver of a serial turbo encoder but also a channel interleaver.

The term "area" as used herein refers to each address area when the virtual interleaver size is divided, and the term "group" refers to each address area divided by the invalid addresses generated by the added offset value. In addition, the interleaver according to the present invention is called an offset controlled PN interleaver (OCPNI).

Figure 2:
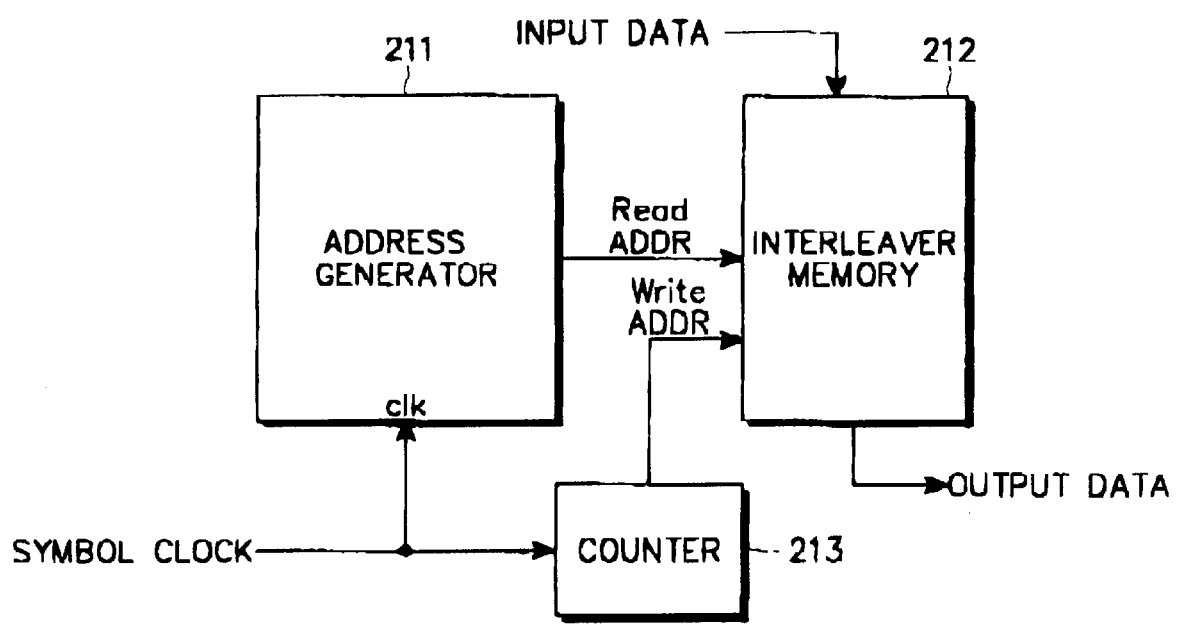
FIG. 2 is a block diagram illustrating an interleaving device in a communication system according to an embodiment of the present invention.
Figure 3:
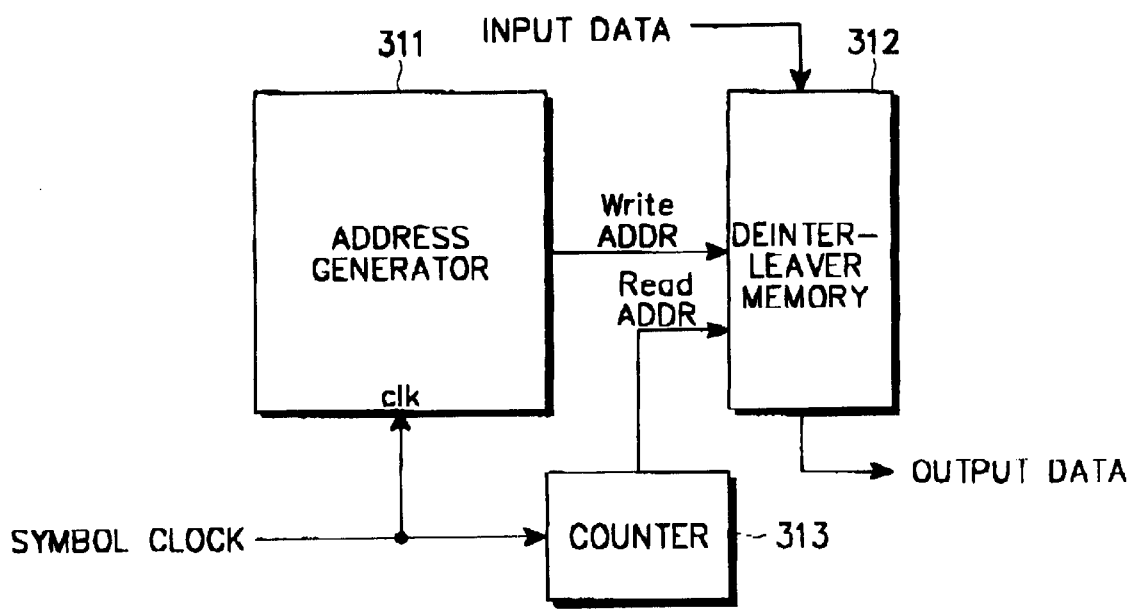
FIG. 3 is a block diagram illustrating a deinterleaving device in a communication system according to an embodiment of the present invention.

FIGS. 2 and 3 show the structure of interleaver and deinterleaver according to the present invention, respectively.

With reference to FIG. 2, a description will be made of the interleaver for interleaving the frame data output from the first component encoder. An address generator 211 generates a read address for rearranging the sequence of data bits according to an input frame data size L and an input clock, and provides the generated address to an interleaver memory 212. The interleaver memory 212 sequentially stores the input data in a write mode of operation, and reads the data according to the address provided from the address generator 211 in a read mode of operation. A counter 213 receiving an input clock, provides a write address to the interleaver memory 212. As stated above, the interleaver sequentially stores input data in the interleaver memory 212 in the write mode of operation, and reads the data stored in the interleaver memory 212 according to the read address generated by the address generator 211 in the read mode of operation. Alternatively, the interleaver can store the input data in the interleaver memory 212 after rearranging the sequence of the data bits in the write mode of operation, and sequentially read the data in the read mode of operation.

With reference to FIG. 3, a description will be made of the deinterleaver according to an embodiment of the present invention. An address generator 311 to generates a write address for restoring the sequence of the input data to the original state according to the input frame data size L and the input clock, and provides the generated write address to a deinterleaver memory 312. The deinterleaver memory 312 stores the input data according to the write address provided from the address generator 311 in the write mode of operation, and sequentially reads the stored data in the read mode of operation. A counter 313 receiving the clock, provides the deinterleaver memory 312 with a read address for reading the data from the deinterleaver memory 312. As stated above, the deinterleaver has the reverse operation of the interleaver but has the same structure as the interleaver. The only difference therebetween is the sequence of the input data bits in the write and read modes. Therefore, a description hereinbelow will be made with reference to only the interleaver.

Now, a description will be made of an interleaving device according to a first embodiment of the present invention. The interleaving device according to the first embodiment of the present invention performs interleaving according to an algorithm shown in Equation 1 below.

[Equation 1]
```
{N=L+OSV;
i=0;
/*Find N=2^m×N_g*/
for(ADDRESS_WRITE=0;ADDRESS_WRITE<=2^m-2;ADDRESS_WRITE++)
   {for(g=0;g<=N_g-1;g++)
      {ADDRESS_READ[i]=[PN_g(ADDRESS_WRITE)-1]*g*2^m;
      if(ADDRESS_READ<=L-1){
      ADDRESS_READ[i]=ADDRESS_READ[i]-OFFSET(ADDRESS_READ[i],GTH); i++;
      }
   }
   /*Overwrite ADDRESS_READ with the same address as ADDRESS_WRITE*/
   ADDRESS_WRITE=(2^m-1);
   for(g=0;g<=N_g-1;g++)
   {ADDRESS_READ[i]=ADDRESS_WRITE+g*2^m-OFFSET(ADDRESS_WRITE, GTH); i++;
   }
}
/*OFFSET Generation Algorithm*/
function OFFSET(ADDRESS_READ,GTH){
if(ADDRESS_READ<GTH[0])OFFSET=0;
else if(GTH[0]<ADDRESS_READ<GTH[1])OFFSET=1;
else if(GTH[1]<ADDRESS_READ<GTH[2])OFFSET=2;
else if(GTH[2]<ADDRESS_READ<GTH[3])OFFSET=3;
else if(GTH[3]<ADDRESS_READ<GTH[4])OFFSET=4;
else if(GTH[4]<ADDRESS_READ<GTH[5])OFFSET=5;
else if(GTH[5]<ADDRESS_READ<GTH[6])OFFSET=6;
else OFFSET=7;
}
```

The read address (ADDRESS_READ) generated in Equation 1 is separated into $N_g$ respective areas, the number of read addresses in each respective area is $2^m$, and the number of random address components generated by the pseudo random generator (PN generator) corresponding to each respective area is $2^m-1$.

The read address generated in accordance with Equation 1 is mapped with the original address on a one-to-one basis, and such an interleaver has the property of the PN interleaver and the distance property. Here, OFFSET (ADDRESS_READ,GTH) is a function for determining to which group the read address belongs, and shifting the address by the offset value.

Figure 4:
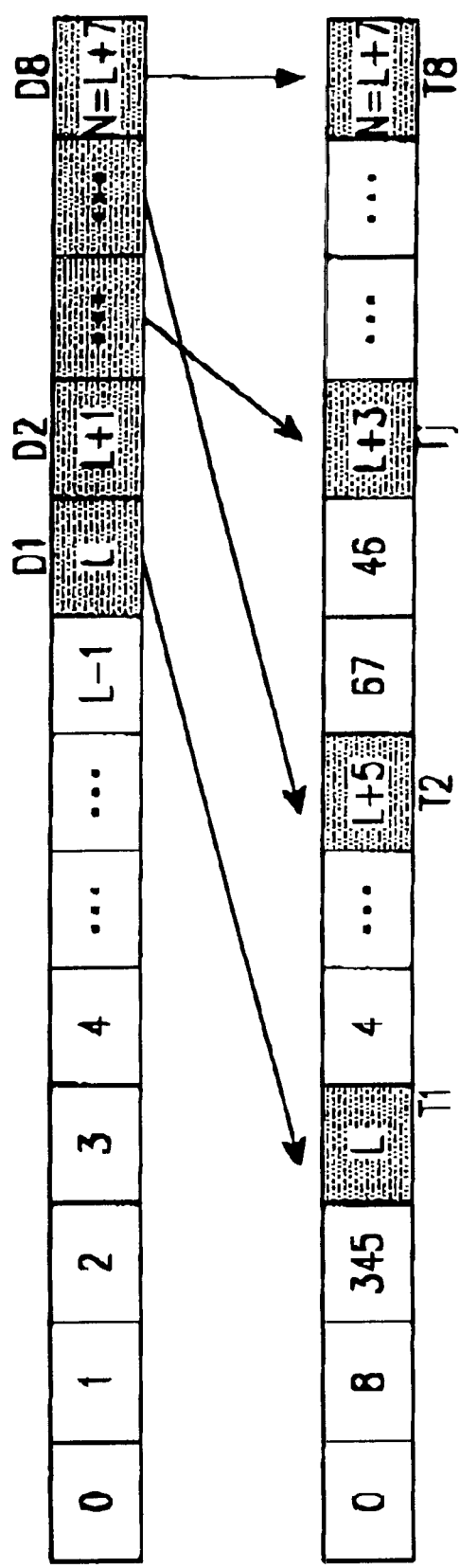
FIG. 4 is a diagram illustrating that the data bits interleaved according to an offset value exist between interleaved data bits, when interleaving is performed using a virtual address area determined by adding the offset value to the input data size.

When a specific address of the interleaver memory is addressed to read data without shifting the address by the offset value, a number of invalid data bits are read equal to the number of the offset values. That is, 8 invalid read addresses corresponding to the offsets [L, . . . , N−1] exist between interleaving sequences, in addition to the read addresses corresponding to the input data bits [0, . . . , L−1], as shown in FIG. 4. In this case, since N data bits (where N=OSV+L, OSV=8) are transmitted, it is necessary to delete the addresses existing between the interleaving sequences and connect the addresses. This will be described with reference to FIG. 5.

For example, when one of several combinations which can express the newly calculated virtual interleaver size N in terms of $N_g \times 2^m$ is selected, the size of each address generation area is determined. An invalid address generated by the offset value (OSV) is determined based on an initial value of a PN generator, generated in the last address generation area. A position GTH (Group Threshold) of the invalid address depends on how the whole addresses are generated. In other words, when generating an address using a PN generator corresponding to its associated address generation area, the position is determined based on how to (i.e., sequentially or randomly) select the initial value of each PN generator and the address generated in each address generation area. That is, when the interleaving rule is known, it is possible to know the position where the invalid address is generated by the added offset value.

This means that it is possible to sequentially output the interleaved stored data bits excluding the invalid data bits corresponding to the invalid addresses. More specifically, the read addresses corresponding to the last 8 stored data bits [L, . . . , N−1] out of the stored data bits are determined regularly according to the interleaving rule. Therefore, it is possible to previously know the positions of the interleaved invalid data bits. Assume that the addresses for 8 tail data bits are D1, D2, D3, . . . , D8 [i.e., L, . . . , N−1], and an interleaving address corresponding to each address Di (i=1, . . . , 8) is Tk=PRIB(Di), where k=1, . . . , 8. Of course, it is not always true that T1<T2 for D1<D2, and the interleaving address is arranged in a also given order. Therefore, for convenience, assume that an index controlled to arrange the interleaving address in order of T1< T2<. . . <T8 is defined as 'j' and an address using this is defined as Tj (j=1 . . . 8). Then, N interleaving areas are divided into 8 groups on the basis of the addresses, and each Tj becomes a threshold for distinguishing a boundary thereof. Here, the addresses should be connected by excluding the thresholds. For example, all the generated addresses will have values between [0, . . . , L−1], by generating a read address 0 for G0, a read address 1 for G1, . . . , and a read address 7 for G7.

Figure 7:
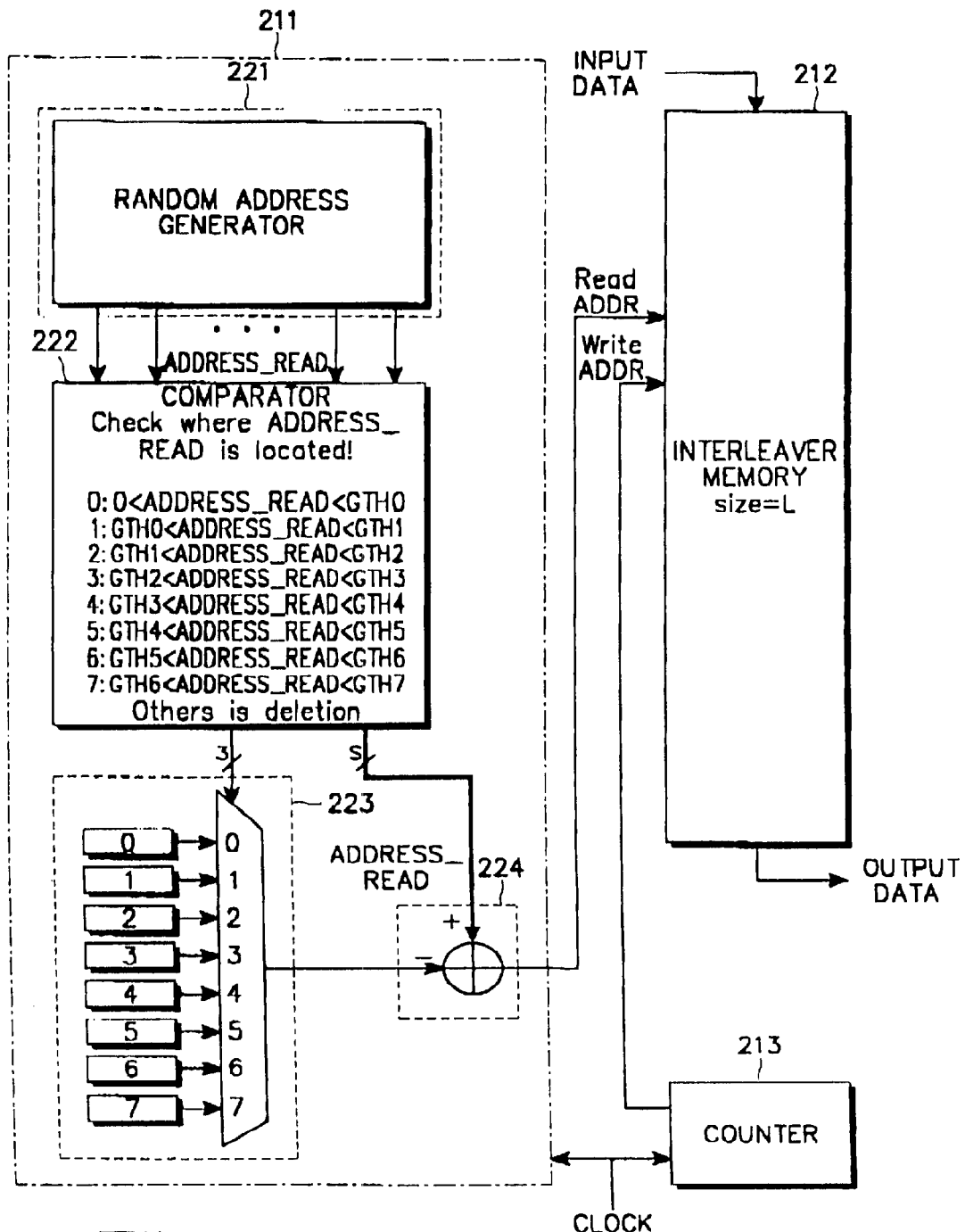
FIG. 7 is a block diagram further illustrating the interleaving device of FIG. 2 according to a first embodiment of the present invention.

A hardware structure implemented for the algorithm of Equation 1 is shown in FIG. 7. In particular, FIG. 7 shows a detailed structure of the address generator 211 for reading the data stored sequentially in the interleaver memory 112 by interleaving according to an embodiment of the present invention.

Referring to FIG. 7, a random address generator 221 generates random address components using a plurality of PN generators. A comparator 222 compares the random addresses output from the random address generator 221 with the thresholds GTH (i.e., group values for grouping the address areas) previously determined by the offset value to determine to which group they belong, and outputs a group select signal and the random addresses. Further, the comparator 222 compares the random addresses output from the random address generator 221 with the group thresholds GTH determined by the offset value and deletes the corresponding random address when any one of them is identical. A selector 223 selects the corresponding group value in response to the select signal. A subtracter 224 subtracts a specific group value output from the selector 123 from the random address output from the comparator 222, and generates a read address for reading the data from the interleaver memory 212.

Figure 8:
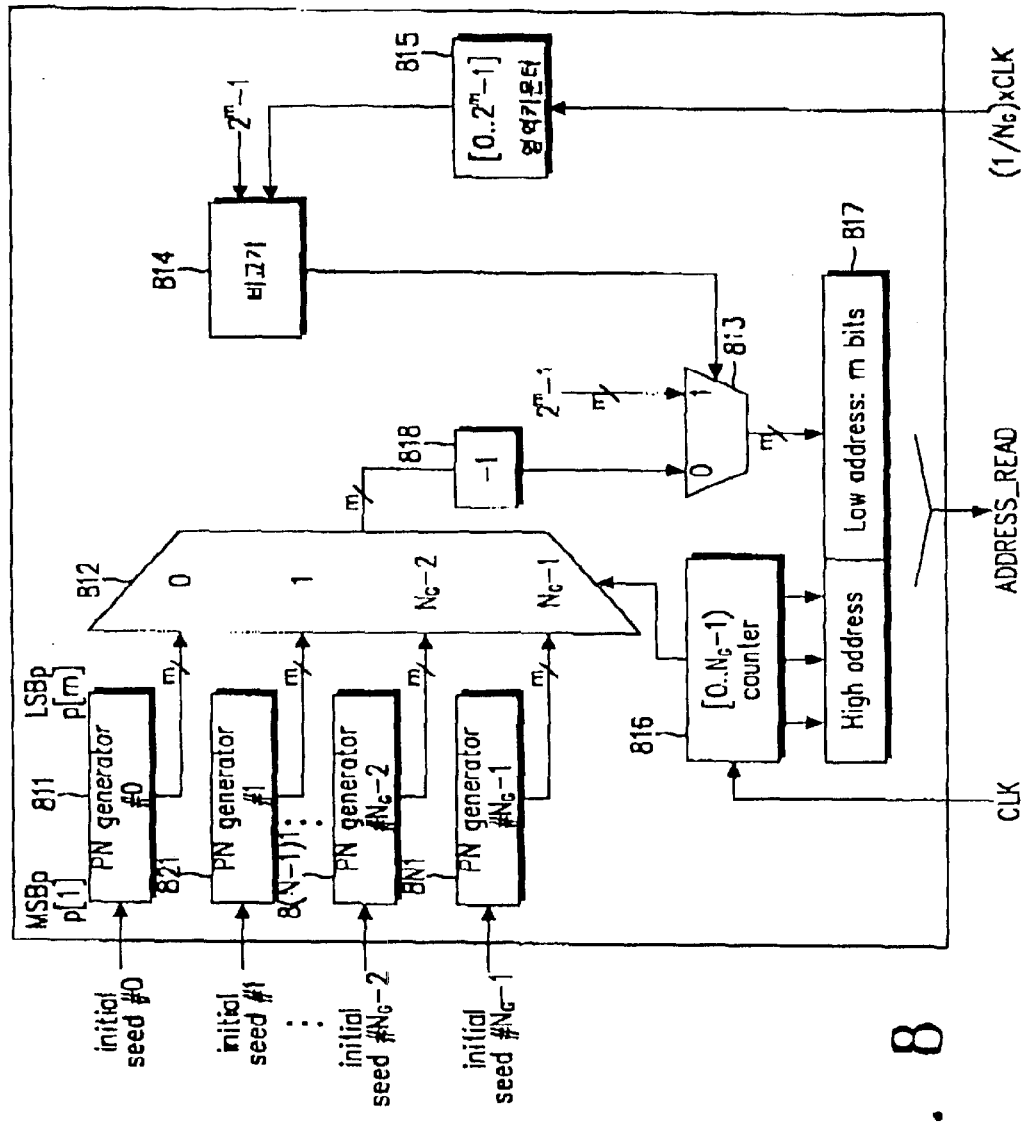
FIG. 8 is a detailed block diagram of the address generator shown in FIG. 7.

FIG. 8 shows the detailed structure of the random address generator 221 of FIG. 7. Referring to FIG. 8, PN generators 811-8N1 generate PN sequences, which are address components, for changing the sequence of the data bits stored in the associated address generation areas, and provide the generated PN sequences to a first multiplexer 812. The respective PN generators 811-8N1 are initialized to different initial values. A counter 816 generates a select signal for selecting an output of the first multiplexer 812. If the number of address areas is $N_g$, the counter 816 generates the select signals of 0 ... $N_g-1$. The select signals can be generated either sequentially or randomly. In random generation, the select signals are generated randomly according to a predetermined pattern, determined through an algorithm, which will be described below. The multiplexer 812 selects the output of the PN generators according to the select signals provided from the counter 816. The output data of the multiplexer 812 is subtracted by a value of 1 in a subtracter 818 and provided to a second multiplexer 813. This is because the PN generators cannot generate the address value 0. Therefore, all the generated values are subtracted by 1 so as to map the random addresses from the address value 0. An area (or group) counter 815 generates a count value corresponding to the address generation area size and provides the generated count value to a comparator 814. The comparator 814 outputs a select signal '1' to the second multiplexer 813, when the count value provided from the area counter 815 corresponds to an area size $2^m-1$. The second multiplexer 813 selects the output of the first multiplexer 812 according to the select signal, when the count value output from the area counter 815 is lower than or equal to $2^m-2$, and selects $2^m-1$ provided from the comparator 814, when the count value reaches $2^m-1$. An address buffer 817 stores the output data of the counter 816 in a high address area, and the output data of the second multiplexer 813 in a low address area. The addresses stored in the address buffer 817 are provided to the comparator 222 of FIG. 7. Referring again to FIG. 7, the comparator 222 then determines to which group the addresses belong, and provides the group select signals to the selector 223. The selector 223 selects the corresponding group values according to the select signals. The subtracter 224 subtracts the offset value of selected group values from the addresses output from the comparator 222 to provide the final addresses to the interleaver memory 212, and reads the data corresponding to the read addresses from the interleaver memory 212.

A procedure for generating the read addresses will be described with reference to FIGS. 7 and 8. The PN generators 811–8N1 generate PN sequences by shifting the stored state values by clocking to generate PN sequences, and the first multiplexer 812 selects states of the PN generators 811–8N1 according to the select signals provided from the counter 816. When the states of the PN generates are all selected according to the select signals, the PN generators 811–8N1 generate PN sequences by shifting the stored states by clocking. The PN sequences output from the first multiplexer 812 are subtracted by 1 and applied to the second multiplexer 813. The PN sequences are provided to the low address area of the address buffer 817 until the address count value counted in the area counter 815 is lower than the address generation area size value $2^m-1$.

However, when the address count value reaches the address generation area size $2^m-1$, the value $2^m-1$ is provided to the low address area of the address buffer 817. The address buffer 817 stores in the high address area the values indicating the address generation areas corresponding to the presently selected PN generators, output from the counter 816. The addresses stored in the address buffer 817 are provided to the comparator 222, and the comparator 222 determines to which group the addresses belong and provides the select signals for the group values to the selector 223. The addresses are provided to the subtracter 224. The selector 223 then selects the corresponding group value according to the select signal, and the subtracter 224 subtracts the corresponding offset value of selected group value from the address value output from the comparator 222, to provide a read address to the interleaver memory 212. However, when the address does not belong to any group, i.e., when the address corresponds to the threshold values, the comparator 222 deletes the address, regarding the address as an invalid address. The interleaver memory 212 outputs the data stored in the corresponding address according to the provided read address.

Figure 9:
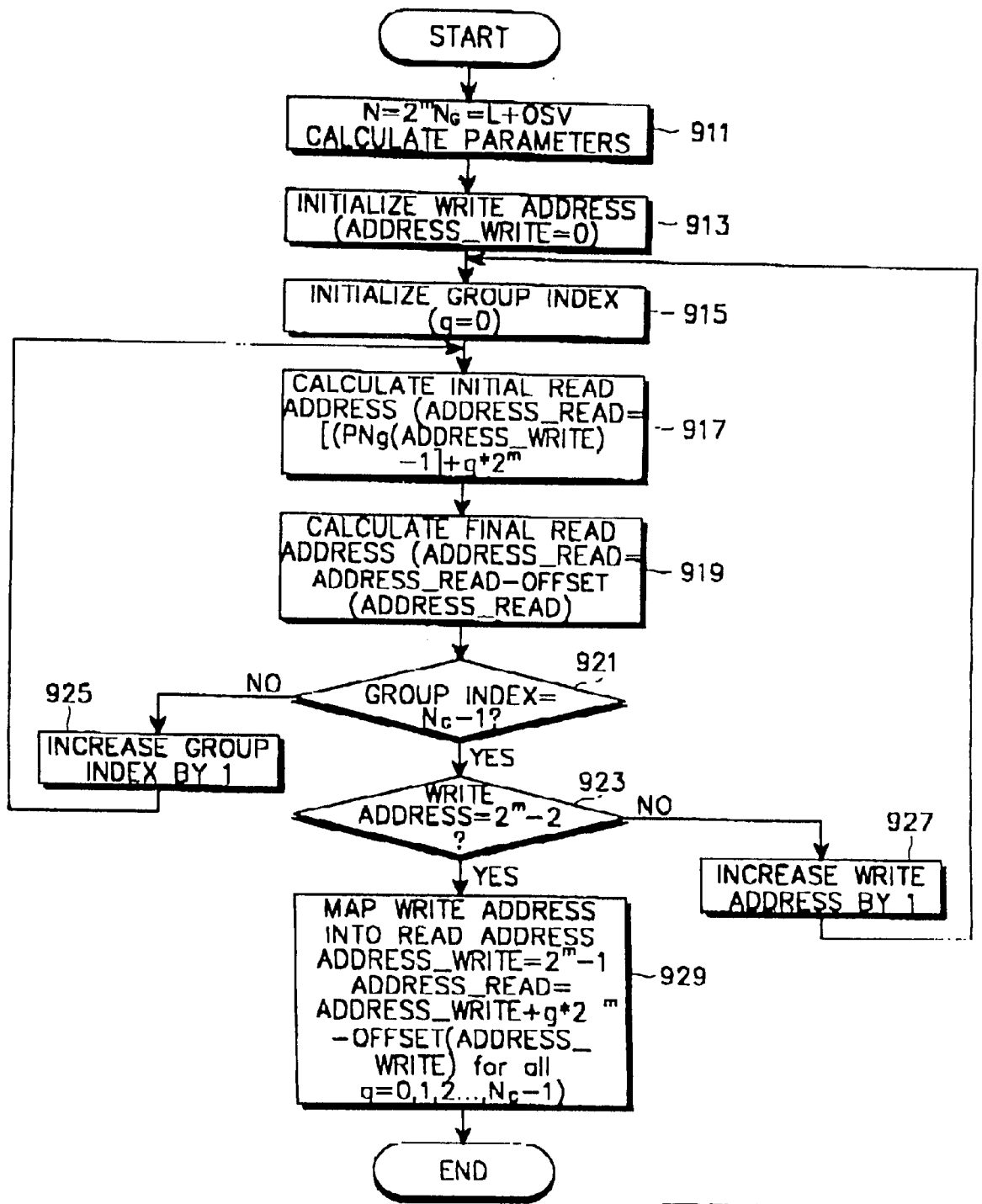
FIG. 9 is a flow chart illustrating a procedure for generating an interleaving address according to a first embodiment of the present invention.

With reference to FIG. 9, a description will be made of a procedure for generating an interleaving address in the address generator 221. The procedure of FIG. 9 is based on the algorithm of Equation 1.

Referring to FIG. 9, the address generator 221 (or a general CPU) calculates respective parameter values for interleaving in step 911. The address generator 221 determines the virtual address size N by adding a proper value (i.e., offset value) such that the number of zero bits from the LSB should be at least one, when the input frame size L is converted to a binary value. Further, when the virtual address size N is expressed in terms of a power of 2 ($2^m \times N_g$), the value m and the group number $N_g$ are determined through an algorithm, which will be described later. The parameters are previously fixed in the designing process, and these values are stored in a look-up table. During interleaving, the corresponding values are read from the look-up table.

The address generator 221 initializes the write address to '0' in step 913, and initializes a group index 'g' to '0' in step 915. After initialization, the address generator 221 calculates the random address using the PN sequence in accordance with a formula below in step 917.

$$\text{ADDRESS\_READ} = (\text{PN}_g(\text{ADDRESS\_WRITE}) - 1) + g*2^m$$

where $\text{PN}_g(\text{ADDRESS\_WRITE})$ denotes a function for generating the PN sequence and is subtracted by 1 to map the generated PN sequences from 0. Further, $+g* 2^m$ is to map the generated PN sequence into the corresponding area. That is, when the group index is g=0, the generated PN sequence is mapped into the area 0, and when the group index is g=1, the generated PN sequence is mapped into the area 1.

The address generator 221 calculates the final read address using the calculated PN address in accordance with a formula below, in step 919.

$$\text{ADDRESS\_READ} = \text{ADDRESS\_READ} - \text{OFFSET}(\text{ADDRESS\_READ}, \text{GTH})$$

The above formula defines an address calculated by determining to which group the read address belongs and subtracting the offset value of the selected group value corresponding to the determined group therefrom. The above group is distinguished by the group value, such as the interleaved addresses which are generated by the offset value (=invalid address). For example, when the read address corresponds to the group 1, the read address is subtracted by 1, and when the read address corresponds to the group 2, the read address is subtracted by 2.

Thereafter, the address generator 221 examines in step 921 whether the group index 'g' has reached the read number $N_g-1$. When the group index has reached $N_g-1$, the address generator 221 proceeds to step 923. Otherwise, when the group index has not reached $N_g-1$, the address generator 221 proceeds to step 925 to increase the group index by 1 and returns to step 917. Meanwhile, upon detecting that the group index has reached the group number $N_g-1$, the address generator 221 examines in step 923 whether the write address has reached a value $2^m-2$ (the number of addresses which can be generated by one PN generator). Here, the write address corresponds to the area counter. When the write address has reached the value $2^m-2$, the address generator 221 proceeds to step 929. Otherwise, when the write address has not reached the value $2^m-2$, the address generator 221 proceeds to step 927 to increase the write address by 1 and returns to step 915.

In step 929, the address generator 221 maps the write address into the read address of each area using a formula below, and then ends the program.

ADDRESS_WRITE=$2^m$-1; ADDRESS_READ=ADDRESS_WRITE+g*$2^m$-OFFSET(ADDRESS_WRITE)

That is, it means that the last write address is used for the read address. That is, since each address generator can generate only $2^m-1$ addresses in maximum, the last write address is used for the read address.

Tables 1 and 2 below show OCPNI design parameters for each Rate Set when the interleaving method according to the present invention is applied to an IMT-2000 system.

TABLE 1

| Rate Set 1 | @19.2 kbps | @38.4 kbps | @76.8 kbps | @153.6 kbps | @307.2 kbps |
|---|---|---|---|---|---|
| Interleaver Size L | 376 | 760 | 1528 | 3064 | 6136 |
| OSV | 8 | 8 | 8 | 8 | 8 |
| N = L + OSV | 384 | 768 | 1536 | 3072 | 6144 |
| M | 6 | 7 | 8 | 9 | 10 |
| $N_g$ | 6 | 6 | 6 | 6 | 6 |
| Initial Parameter | 101011 | 1010110 | 10101101 | 101011010 | 1010110101 |
| | 010100 | 0101001 | 01010010 | 010100101 | 0101001010 |
| | 111011 | 1110110 | 11101101 | 111011010 | 1110110101 |
| | 101111 | 1011111 | 10111110 | 101111101 | 1011111010 |
| | 011101 | 0111010 | 01110101 | 011101010 | 0111010101 |
| | 011010 | 0110101 | 01101010 | 011010101 | 0110101010 |
| GTH {t0, t1, t2, t3, t4, t5, t6, t7} | {23, 41, 65, 107, 119, 131, 269, 383} | {47, 77, 191, 335, 401, 425, 641, 767} | {491, 599, 737, 755, 1187, 1211, 1265, 1535} | {659, 1373, 2027, 2447, 2531, 2825, 2861, 3071} | {881, 2159, 2429, 2807, 4307, 4559, 4931, 6143} |
| PN Generator Polynomial p(x) | [1100001] | [10010001] | [101110001] | [1000100001] | [10010000001] |

TABLE 2

| Rate Set 2 | @28.8 kbps | @57.6 kbps | @115.2 kbps | @230.4 kbps | @460.8 kbps |
|---|---|---|---|---|---|
| interleaver Size L | 568 | 1144 | 2296 | 4600 | 9208 |
| OSV | 8 | 8 | 8 | 8 | 8 |
| N = L + OSV | 576 | 1152 | 2304 | 4608 | 9216 |
| m | 6 | 7 | 8 | 9 | 10 |
| $N_g$ | 9 | 9 | 9 | 9 | 9 |
| Initial Parameter | 101011 | 1010110 | 10101101 | 101011010 | 1010110101 |
| | 010100 | 0101001 | 01010010 | 010100101 | 0101001010 |
| | 101010 | 1010100 | 10101001 | 101010010 | 1010100101 |
| | 011011 | 0110111 | 01101110 | 011011101 | 0110111010 |
| | 001011 | 0010110 | 00101101 | 001011010 | 0010110101 |
| | 111100 | 1111001 | 11110010 | 111100101 | 1111001010 |
| | 110111 | 1101110 | 11011101 | 110111010 | 1101110101 |
| | 100011 | 1000111 | 10001110 | 100011101 | 1000111010 |
| | 110000 | 1100000 | 11000001 | 110000010 | 1100000101 |
| GTH {t0, t1, t2, t3, t4, t5, t6, t7} | {107, 305, 332, 368, 431, 449, 467, 575} | {179, 224, 395, 611, 710, 746, 1070, 1151} | {485, 647, 854, 881, 1529, 1565, 1646, 2303} | {197, 323, 764, 818, 2144, 3185, 4166, 4607} | {2006, 2384, 2942, 6074, 7991, 8396, 8963, 9215} |
| PN Generator Polynomial p(x) | [1100001] | [10010001] | [101110001] | [1000100001] | [10010000001] |

Figure 6:
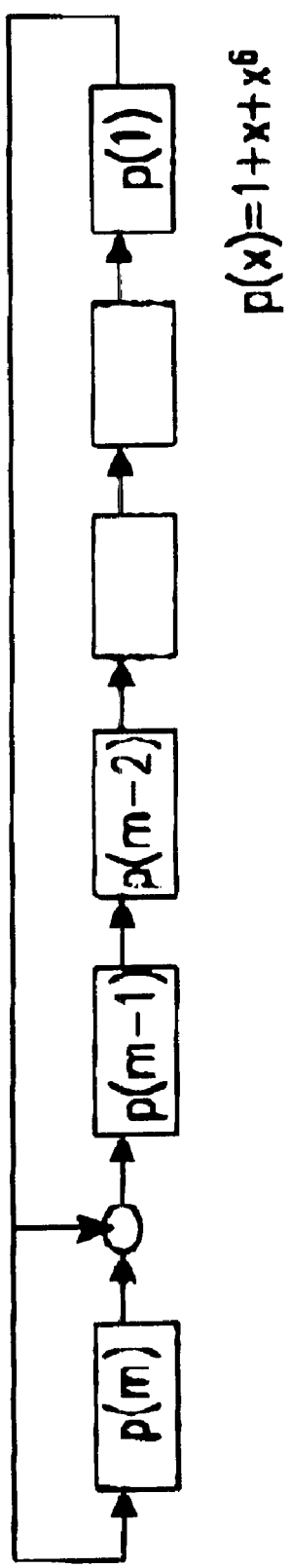
FIG. 6 is a diagram illustrating a PN generator having a generator polynomial of $(1+x+x^6)$.

In Tables 1 and 2, p(x) is a primitive polynomial of the PN generator determined on a Galois field GF(2), wherein the leftmost bit indicates a coefficient of 0th order of p(x) and the rightmost bit indicates a coefficient of the highest order. That is, p(x)=[1100001] indicates $p(x)=1+x+x^6$. A PN generator corresponding to the generator polynomial $p(x)=1+x+x^6$ is illustrated in FIG. 6.

In general, in the initialization process, the initial seeds corresponding to the respective areas are loaded on m shift register cells. Thereafter, the register values are updated every clock by the connected line, and after update, a 6-bit address is generated by the combination of the values (0/1) stored in the register. That is, when the content of the lowest order is p[1] and the content of the highest order is p[m], $PN_g$(ADDRESS_WRITE) indicates an address obtained by converting the shift register's binary value of (p[1]p[2] . . . p[m−1]p[m]) to a decimal number $(=p[1]2^{m-1}+ \ldots +p[m]2^0)$ when clocking is performed at an initial time by write address ADDRESS_WRITE. In addition, the address generated from the PN generator has a period of $2^m-1$. Further, since the initial seeds are not zero, all the generated addresses have the values within a range of $\{1 \leq k \leq 2^m-1\}$. Therefore, [$PN_g$(ADDRESS_WRITE)−1] has the value within the range of $\{0 \leq k \leq 2^m-2\}$. In this case, since the number, $2^m-1$, of the addresses generated by the PN generator is smaller by one than the number, $2^m$, of the required addresses, the last address in every area is overwritten and then used as the read address ADDRESS_READ. In Equation (1), this relation is expresses as follows:

ADDRESS_WRITE=ADDRESS_WRITE+g* $2^m$−OFFSET(ADDRESS_WRITE)

Table 3 below shows OCPNI read addresses for an interleaver having a size of L=376 and generated based on Table 1.

mials of the PN generators or the initial seeds are determined through an algorithm described below, in the first embodiment, the invalid addresses GTH generated by the offset values are deleted by the comparator 222. However, in an alternative embodiment, since the PN generator 8N1 corresponding to the last area generates an invalid address (low address GTH) caused by the offset value, there is a method of essentially preventing generation of such invalid address. In this case, the deletion function of the comparator 222 is unnecessary.

Next, a detailed description will be made of an interleaving device for essentially preventing generation of the invalid addresses according to a second embodiment of the present invention.

A main idea of the OCPNI is to determine a new frame size N by adding an offset value OSV to the interleaver size L, and then divide the virtual interleaver size N into $N_g$ areas to permute each group element using the PN generator. The PN generators generate $2^m$ address components. Since the last PN generator ($g=N_g-1$) generates the invalid address caused by the OSV, it is necessary to delete this invalid address so that the total address number generated by the OCPNI address generation block should be L. Therefore, the invention implements a control logic which monitors the address generated from the last PN generator ($g=N_g-1$ designated in the step 923 in FIG. 9) to skip selection of the PN generator when the address is the invalid address caused by the added offset value.

First, if it is assumed that the interleaver size L=60, offset value OSV=4, virtual interleaver size N=64, generator polynomial's order m=4 and group number $N_g$=4, then the number of the PN generators is 4 and each of them has a period of 15. Further, assume that the PN sequence gener-

TABLE 3

36 73 172 230 317 332 33 68 165 226 286 373 16 113 146 224 318 346 55 88
184 223 302 27 123 171 207 294 365 13 149 199 290 342 6 78 138 195 288
50 118 180 193 287 364 40 106 169 192 271 357 35 100 148 239 262 338 17 97
185 215 259 8 80 156 203 257 363 51 119 189 197 256 341 25 91 158 194 303
330 12 77 190 240 279 372 53 70 174 231 267 361 26 114 166 211 261 340 60
104 162 201 258 45 99 160 196 304 348 22 81 159 241 295 58 72 143 216 275
350 44 115 135 251 265 37 89 131 221 260 366 18 76 129 206 305 358 56 117
128 246 280 354 43 90 175 234 315 352 21 124 151 228 285 351 10 109 139 225
270 335 52 86 133 208 310 327 41 122 130 247 298 323 20 108 176 219 292 321
57 101 167 205 289 320 28 82 147 198 272 367 61 120 137 243 311 343 30 107
132 232 283 331 62 85 177 227 269 325 46 74 152209 262 322 38 116 187 200
306 368 34 105 157 243 296 359 32 84 142 217 291 339 31 121 182 204 272 329
15 92 170 245 264 324 7 125 164 218 307 369 3 94 161 252 281 344 1 126
144 237 268 1 110 183 214 309 349 47 102 155 250 282 334 23 98 141 236 316
374 11 96 134 229 301 362 5 95 178 210 278 356 2 79 168 248 314 353 48
71 163 235 300 336 39 67 145 213 293 375 19 65 136 202 274 347 9 64 179
244 312 333 4 111 153 233 299 326 49 87 140 212 277 370 24 75 181 249 266
360 59 69 154 220 308 355 29 66 188 253 297 337 14 112 173 222 276 328 54
103 150 254 313 371 42 83 186 238 284 345 63 127 191 255 319

As described above, in the OCPNI according to the first embodiment of the present invention, the primitive polynoated by the last PN generator is given as shown in Table 4 below.

TABLE 4

| Time k: | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| PN3(k): | 5 | 1 | 13 | 2 | 7 | 15 | 14 | 3 | 6 | 4 | 8 | 12 | 9 | 11 | 10 | |
| PN3(k)-1: | 4 | 0 | 12 | 1 | 6 | 14 | 13 | 2 | 5 | 3 | 7 | 11 | 8 | 10 | 9 | |

As shown in Table 4, a state value PN3(k) generated from the last PN generator (g=$N_g$-1) becomes a read address for interleaving the frame data corresponding to the last group, stored in the interleaver memory. Therefore, for OSV=4 and m=4, the $12^{th}$, $13^{th}$, $14^{th}$ and $15^{th}$ addresses of the last group are the invalid addresses. Thus, in this case, the invalid addresses generated from the last PN generator are skipped to the first PN generator. Here, when the PN generators are sequentially selected from the 0th PN generator, the value determined by subtracting '1' from the address generated by the last PN generator is used as a low address for the read address. Therefore, when the last PN generator generates one of the $13^{th}$, $14^{th}$ and $15^{th}$ addresses, the $0^{th}$ PN generator is selected rather than the last PN generator. Further, the invalid address according to 15(PN3(k)-1), which the last PN generator cannot generate, is prevented from being generated by blocking the clock signal or ignoring it by not using even though it is generated. Meanwhile, when the PN generators are randomly selected, the last PN generator may not be selected at the last address of one frame. In this case, the last address ($2^m$-1) is not used, skipping to the next PN generator.

In consideration of the foregoing description, an OCPNI interleaving addresses generating algorithm according to the second embodiment of the present invention can be expressed as shown in Equation 2 below.

[Equation 2]

```
/*OCPNI-2 Program*/
/*N: frame length (=L+OSV) GL: group length 2^m N_g:
   group number*/
For (clk=0; clk<N-N_g;clk++)
  {g=clk % N_g;
    READ_ADDRESS=PNg( )-1+g*GL;
    active=(READ_ADDRESS<L)? ON:OFF;
    if(active==ON) {printf (%d\n,READ_ADDRESS)
      ;}
  }
for (g=1; g<N_g; g++)
   {READ_ADDRESS=GL*g-1;
  printf (%d\n,READ_ADDRESS);
  }
```

Figure 10:
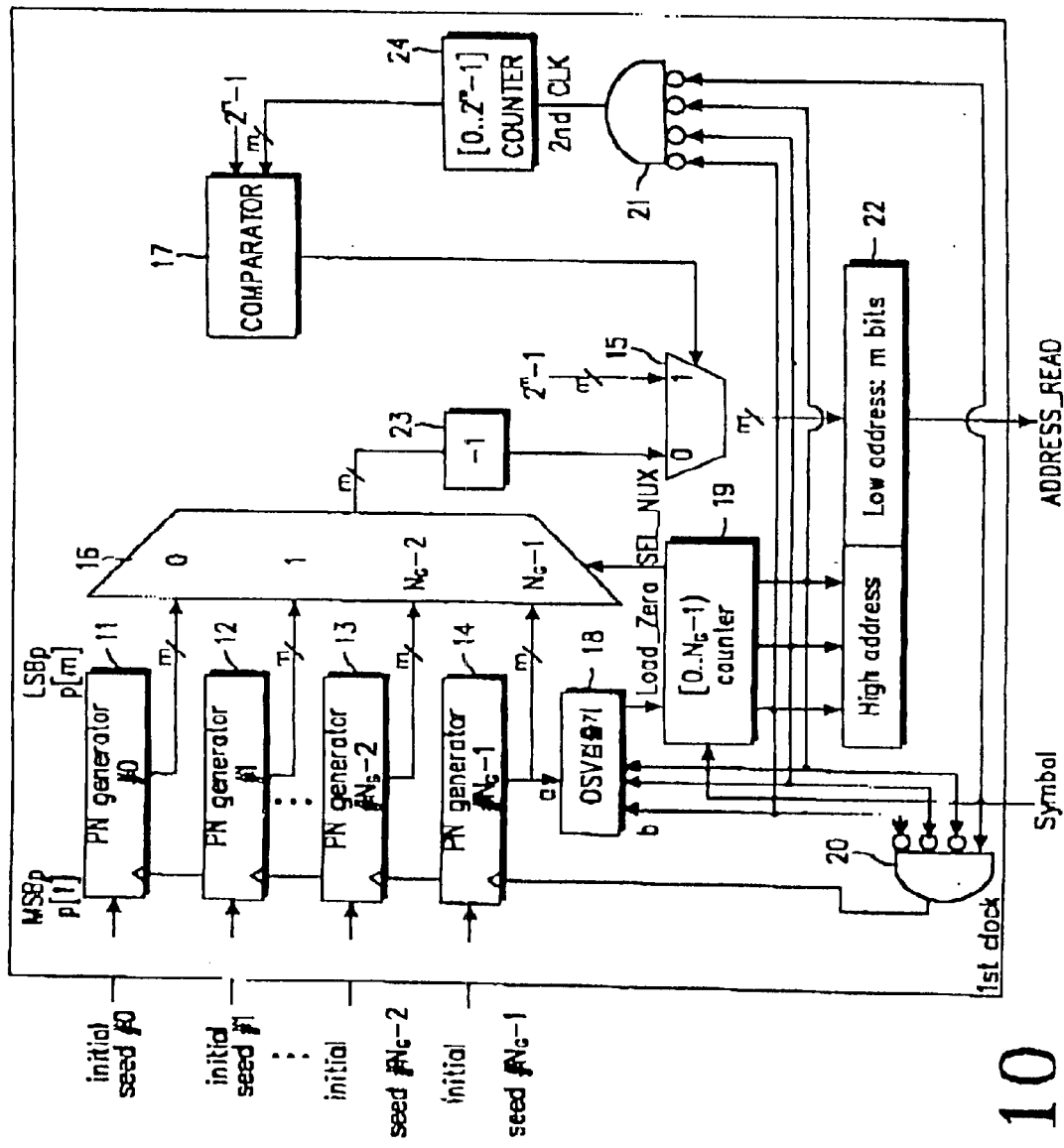
FIG. 10 is a block diagram illustrating an interleaving device according to a second embodiment of the present invention.

The algorithm of Equation 2 can be implemented using the hardware of FIG. 10. Referring to FIG. 10, PN generators 11–14 generate PN sequences for changing the sequence of the data bits stored in the associated address generation areas and provide the generated PN sequences to a first multiplexer 16. The respective PN generators are initialized to an optimal state value determined through an algorithm, which is described below. This will be described later in detail with reference to a method for determining initial seeds of the PN generators. A counter 19 generates a select signal for selecting an output of the first multiplexer 16. If the number of the address areas is $N_g$, the counter 19 generates the select signals of 0 ... $N_g$-1. The select signals can be generated either sequentially or randomly. In random generation, the select signals are generated randomly according to a predetermined pattern, determined through an algorithm. The multiplexer 16 selects the output of the PN generators according to the select signals provided from the counter 19. The output data of the multiplexer 16 is subtracted by 1 in a subtracter 23 and provided to a second multiplexer 15. This is because the PN generators cannot generate the address value 0. Therefore, all the generated values are subtracted by 1 so as to map the random addresses from the address value 0. An area (or group) counter 24 generates a count value corresponding to the address generation area size and provides the generated count value to a comparator 17. The comparator 17 outputs a select signal '1' to the second multiplexer 15, when the count value provided from the area counter 24 corresponds to an area size $2^m$-1. The second multiplexer 15 selects the output of the first multiplexer 16 according to the select signal, when the count value output from the area counter 24 is lower than or equal to an area size $2^m$-2, and selects the area size value $2^m$-1 provided from the comparator 17, when the count value reaches the area size value $2^m$-1. An address buffer 22 stores the output data of the counter 19 in a high address area, and the output data of the second multiplexer 15 in a low address area. The addresses stored in the address buffer 22 are used as addresses for reading the data from the interleaver memory.

An OSV detector 18 receives a state of the last PN generator 14 and the count signal of the counter 19, and provides a reset signal Load_Zero to the counter 19 when it is determined that the PN generator to be selected next according to the count signal is the last PN generator 14 and the state value of the PN generator 14 is an invalid state value (hereinafter, referred to as an offset state value) caused by the added offset value. The counter 19 then generates a select signal for skipping the last PN generator 14 and selecting the next PN generator. If counter 19 is designed to sequentially select the PN generators, the counter 19 will generate a select signal for selecting the first PN generator. Alternatively, if counter 19 is designed to randomly select the PN generators, the counter 19 will generate a select signal for selecting a next PN generator according to a predetermined pattern. At this point, the OSV detector 18 determines whether the present state value stored by AND-OR-ing connection of the last PN generator is the offset state value caused by the added offset value, to output the reset signal Load_Zero. Here, AND-OR-ing connection of the last PN generator is determined according to the shift register cell number m and the offset value OSV.

Figure 12:
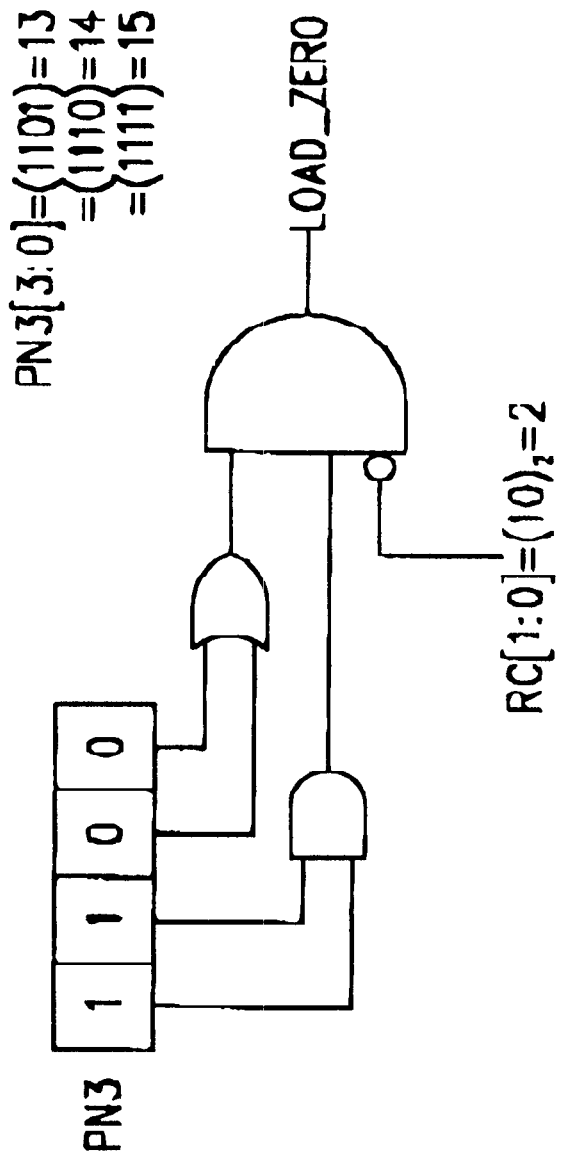
FIG. 12 is a diagram illustrating how to detect an offset value in the last PN generator.

When OSV is a constant, AND-OR-ing connection of the PN generator has a constant rule so that it is very simple to implement. For example, for m=4 and OSV=4, the AND-OR-ing connection is implemented as shown in FIG. 12. Referring to FIG. 12, the lower two register cells undergo OR-ing and the higher two register cells undergo AND-ing. This is, the AND-OR-ing connection is provided to skip (OSV-1) PN addresses corresponding to the $13^{th}$, $14^{th}$ and $15^{th}$ PN to sequences in the last PN generator, because for m=4, the PN generator generates the PN sequences of 1 to 15, and the offset value is OSV=4. Further, the reset signal Load_Zero is generated by AND-ing the output of the AND gate, the output of the OR gate and an inverted output signal of the counter 19. When the PN generators are selected randomly, the last PN generator may not be selected at the last addresses of one frame, the forcedly made last value $2^m$-1 is skipped.

A first logic operator 20 receives the symbol clock SYM_CLK and the count value output from the counter 19, and generates a clock for updating the state values of all the PN generators 11–14 when the count value is logic '0' and the symbol clock is at the rising edge. A second logic operator 21 receives the symbol clock and the count value output from the counter 19, and provides the area counter 24 with a clock for the next counting, when the count value is logic '0' and the symbol clock is at the falling edge.

A procedure for generating the read addresses will be described with reference to FIG. 10. The PN generators 11–14 generate PN sequences by shifting the stored register cell values at every clock provided from the first logic operator 20 to generate PN sequences, and the first multiplexer 16 selects a state of the PN generator according to the select signal provided from the counter 19. The PN sequences output from the first multiplexer 16 are subtracted by 1 in the subtracter 23 and applied to the second multiplexer 15. The PN sequences are provided to the low address area of the address buffer 22 until the address area count signal of the area counter 24 is lower than the address generation area size $2^m-1$ However, when the address count signal reaches the address generation area size $2^m-1$, the value $2^m-1$ is provided to the low address area of the address buffer 22. The address buffer 22 stores in the high address area the count value output from the counter 19. The values stored in the address buffer 22 are used as addresses for reading the data stored in the memory. The OSV detector 18 receives the state of the last PN generator 14 and the count value of the counter 19, detects the offset state value from the last PN generator 14, and provides the counter 19 with the reset signal Load_Zero, when the count value indicates the previous PN generator 13 of the last PN generator 14 according to the predetermined order. The counter 19 then skips selection of the last PN generator 14 so that the first multiplexer 16 should not output the detected offset state, and provides the first multiplexer 16 with a select signal for selecting the PN generator 11. Meanwhile, the count value (which is identical to the select signal) of the counter 19 is provided to the first and second logic operators 20 and 21. The first logic operator 20 receives the count value and the symbol clock, and provides the PN generators with the clock when the count value is '0' and the symbol clock is at the rising edge. The PN generators then update the states according to the symbol clock. The second logic operator 21 receives the count value and the symbol clock, and provides the area counter 24 with the clock when the count signal is '0' and the symbol clock is at the falling edge. The area counter 24 provides the count value to the comparator 17 in response to the clock. Here, the area counter 24 counts a select period of the PN generators. Further, the comparator 17 compares the count value provided from the area counter 24 with the predetermined value $2^m-1$, and outputs the select signal to the second multiplexer 15 when the count value is $2^m-1$ so as to provide the value $2^m-1$ to the low address area of the address buffer 22. That is, the second multiplexer 15 provides the subtracted-by-one PN sequence to the low address area of the address buffer 22 when the number of the select periods of the PN generators is lower than $2^m$. However, when the number of the select periods of the PN generators is $2^m$, the second multiplexer 15 provides the value $2^m-1$ to the low address area.

As stated above, the second embodiment implements a simple logic capable of skipping selection of the offset state of the last PN generator 14 so as to prevent generation of the invalid addresses caused by the added offset. Therefore, the second embodiment does not require the logic circuits (comparator 222 and selector 223 and the operator 224) for deleting the generated invalid addresses in the first embodiment.

Figure 11:
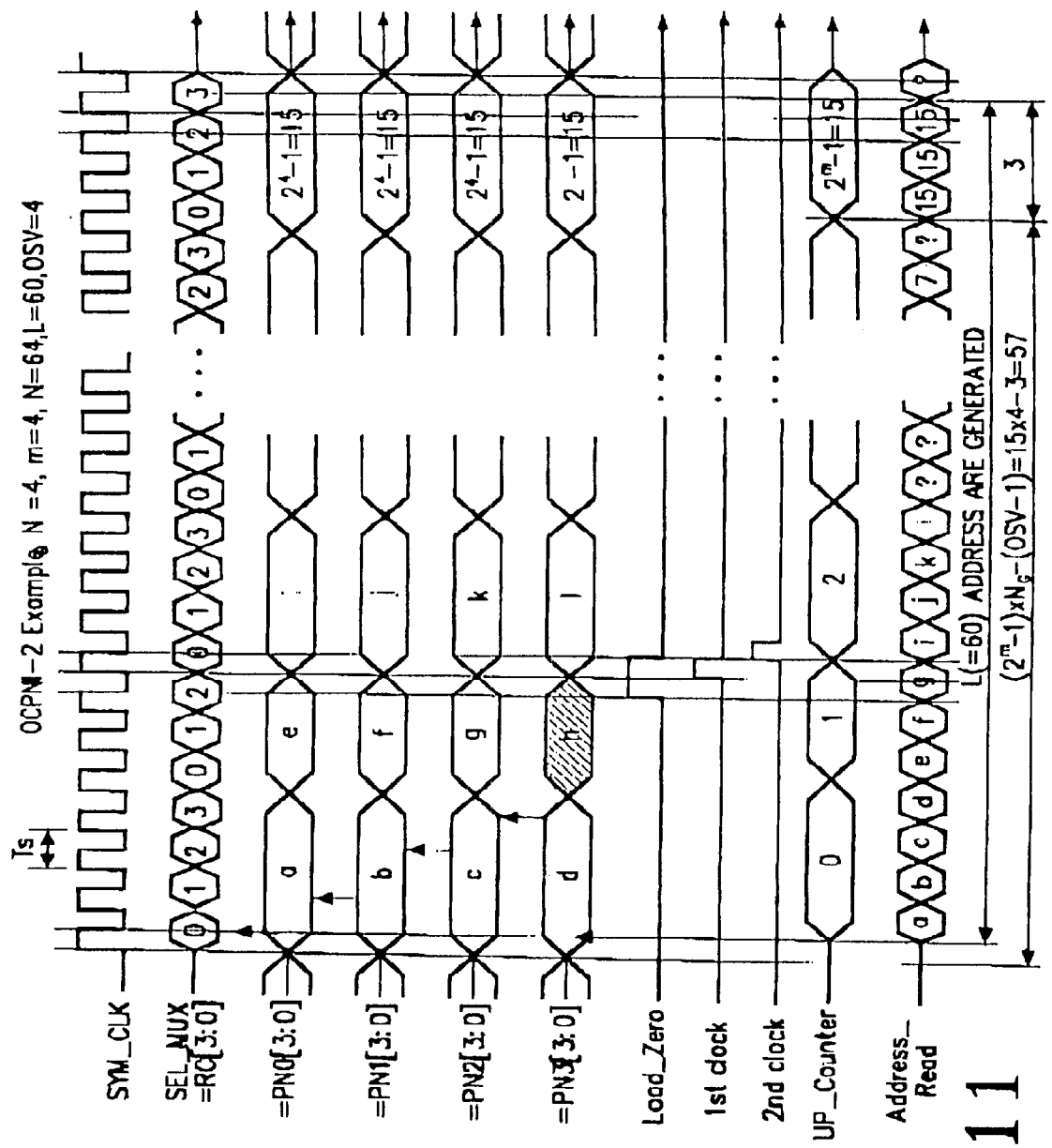
FIG. 11 is a timing diagram of the interleaving device of FIG. 10.

FIG. 11 shows a timing diagram for explaining the procedure for generating the read addresses. Herein, it is assumed that the interleaver size L=60, offset value OSV=4, virtual interleaver size N=64, generator polynomial's order m=4 and group number $N_g$=4.

Referring to FIG. 11, SYM_CLK indicates the symbol clock, and SEL_MUX indicates a select signal for selecting the PN generator. Further, PN[0] indicates a register value of the first PN generator, PN[1] indicates a register value of the second PN generator, PN[2] indicates a register value of the third PN generator, and PN[3] indicates a register value of the last PN generator. Load_Zero indicates a signal for resetting the select signal SEL_MUX so as to skip selection of the last PN generator PN[3] when SEL_MUX is 2 and PN[3] is an invalid value caused by the offset. Further, UP-Counter indicates the area counter, and Address_Read indicates a read address. In addition, a first clock indicates a clock for updating state values of the PN generators, and a second clock indicates a clock, provided from the area counter 24, for counting the number of select periods of the PN generators.

As illustrated, when the Load_Zero signal is enabled, SEL_MUX is reset, responsive to which the first and second clock signals are enabled. Therefore, although the PN generators are not all selected, states of the PN generators are updated according to the first clock and UP_Counter is enabled according to the second clock. That is, the read address is made by skipping the last PN generator and using the register value of the first PN generator. As a result, the finally generated read addresses are 0+a, 16+b, 32+c, 48+d, 0+e, 16+f, 32+g, (h skipped), 0+i, 16+j, 32+k, . . . . And, in case that the final state of the up-counter is $2^m-1$, which is 15 in this example, the read address is 0+15, 16+15 and 32+15 regardless of the state of PN(0)~PN(3).

Figure 13:
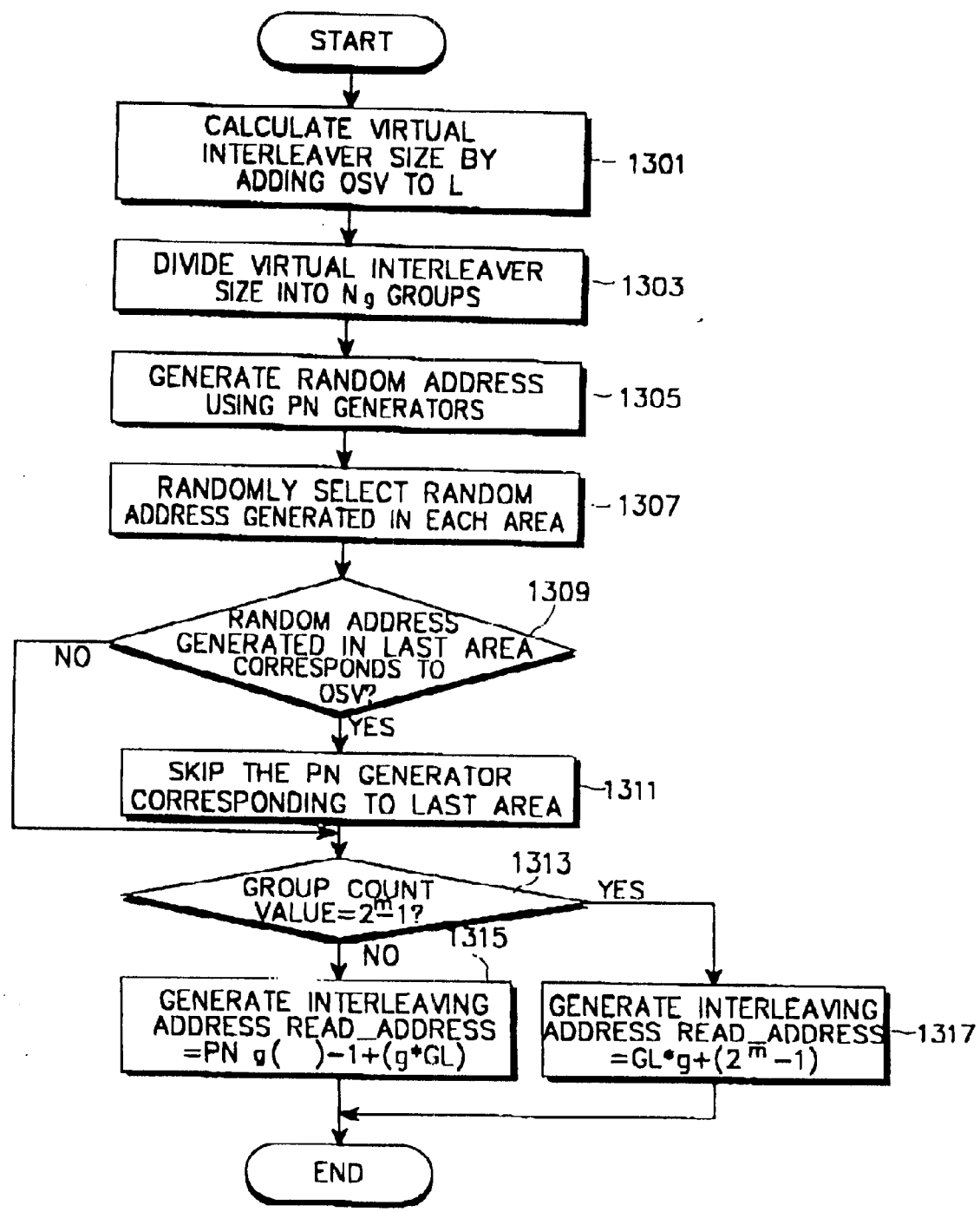
FIG. 13 is a flow chart illustrating a procedure for generating an interleaving address according to a second embodiment of the present invention.

With reference to FIG. 13, a detailed description will be made of a procedure for generating the read address according to the second embodiment of the present invention.

In step 1301, a virtual address area N is determined by adding an offset value OSV to the input frame size L. Then, in step 1303, the virtual address area is divided into a plurality ($N_g$) of address generator areas. Thereafter, in step 1305, random addresses are generated according to the respective address generation areas using the PN generators. In step 1307, the random addresses generated in the respective address generation areas are randomly selected. Alternatively, it is also possible to sequentially select the random addresses generated in the respective address generation areas. In this process, the OSV detector 18 examines whether the random sequence generated by the PN generator corresponding to the last area is an invalid value caused by the added offset value. If it is determined that the generated random sequence is an invalid value, the procedure goes to step 1311 where the random address generated in the last area is not selected (or skipped). Otherwise, when the generated random sequence is not an invalid value, the procedure goes to step 1313 to examine whether the present area count value corresponds to $2^m-1$ (where m denotes the state number of the PN generator). When the area count value does not correspond to $2^m-1$, a read address is generated in accordance with a formula READ_ADDRESS=PNg( )-1+(g*GL) in step 1315. However, when the area count value corresponds to $2^m-1$, the procedure proceeds to step 1317 where the read address is generated in accordance with a formula READ_ADDRESS=GL*g+($2^m-1$).

As described above, the OCPNI according to the second embodiment of the present invention contributes to a reduction in the complexity. Therefore, the parameters according to the rates of the CDMA-2000 forward Supplemental Channel require only the PN generator polynomial, initial register value and OSV. When it is implemented by Equation 1, the group threshold values GTH are not required.

Next, reference will be made to the parameters which should be basically determined in designing the OCPNI according to the second embodiment of the present invention. The basic parameters include the number, $N_g$, of groups and the order, m, of PN generator polynomial according to a given interleaver depth. In the early design process, it is difficult to determine the optimal $N_g$ and m for the frame size of the CDMA-2000 system. Therefore, the values were determined through an algorithm, which will be described below. The determined parameters are shown in Tables 1 and 2. For example, in Rate Set 1 of the CDMA-2000 system, $N_g=6$ for all the frame sizes, based on which the value 'm' is determined. This is to prevent a decrease in the random property in each group, when $N_g$ is excessively high. That is, when $N_g=6$ for $N=384=6\times 2^6$, m=6. Therefore, the data is randomly read at $2^6=64$ addresses per group. Further, the OCPNI which is a 2-dimension interleaver can satisfy the distance property to a some extent.

However, in the first embodiment, a decrease in the frame size FL causes an increase in Eb/No, thus blunting improvement of BER/FER, so that its slope is lower than that of a BER/FER curve of a K=9 convolutional encoder. That is, when Eb/No constantly increases, it is expected that the turbo encoder will perform worst than the conventional encoder. This phenomenon is related to a weight spectrum of the turbo encoder. Therefore, in the second embodiment, all three parameters are considered for optimization of the OCPNI.

As described above, the OCPNI has the parameters $N_g$ and m. Further, the generator polynomials are used for operating the PN generators in the respective groups, and selection of them is another parameter. Finally, with regard to the parameter related to the initial state value of each PN generator, too many combinations exist. Therefore, it is difficult to detect an optimal initial state value using the full search.

As a result, for improvement of the least weight and the overall weight spectrum, (1) $N_g$ is determined, (2) a generator polynomial is selected, and (3) when the least weight is not satisfactory, an initial state value of the PN generator belonging to a group corresponding to the least weight is controlled. In general, it is possible to obtain a turbo interleaver having better performance by repeatedly performing this method several times. This is because a computer search is not effective due to too many combinations of the parameters. First, the functions and parameters will be defined and then an optimal interleaver will be searched using the algorithm of Equation 3 below.

W: Weight Distribution Vector
D(·):Decision Criteria Function
D(W)=1 if W is satisfactory
D(W)=0 if W is not
[Equation 3]
1. Initialize PN generator PNi with initial seed vector Seedi $\in \{0,1\}$ for i=0, . . . , $N_g-1$
   Choose arbitrary primitive polynomial G(x) of order M
   Choose information sequence I's that are expected to generate the minimum weight code
2. For a given Turbo Encoder E, computer W
3. If D(W)== 1, go to 6
4. Find PN generator PNk associated with minimum weight of W
5. Change Seedk such that weight(Seedk, Seedi)==1 and go to 2
6. stop In the algorithm of Equation 3, to reduce the search time, the best G(x) is first selected in a given state and then the algorithm is used. Generally, it is possible to find an interleaver satisfying a given condition after repeating the search three or four times. Of course, although the best G(x) also depends on the initial state (or seed), it is preferable to first select G(x) since the number of the generator polynomials is much lower than the types of the states. Therefore, selection of G(x) is regarded as a coarse estimation process of the interleaver. Such a designed OCPNI has a better weight property that the method performed through experiments and intuition. In general, this guarantees a better BER/FER performance.

Now, a description will be made of a method for optimizing the initial register value.

For example, assume that the initial state value is optimized for 4 PN generators. Since m=5 and $N_g=4$, the state values are initialized as follows:

Group 0: 0 1 0 1 0
Group 1: 1 0 1 0 1
Group 2: 0 0 1 1 0
Group 3: 1 1 0 0 1

Figure 5:
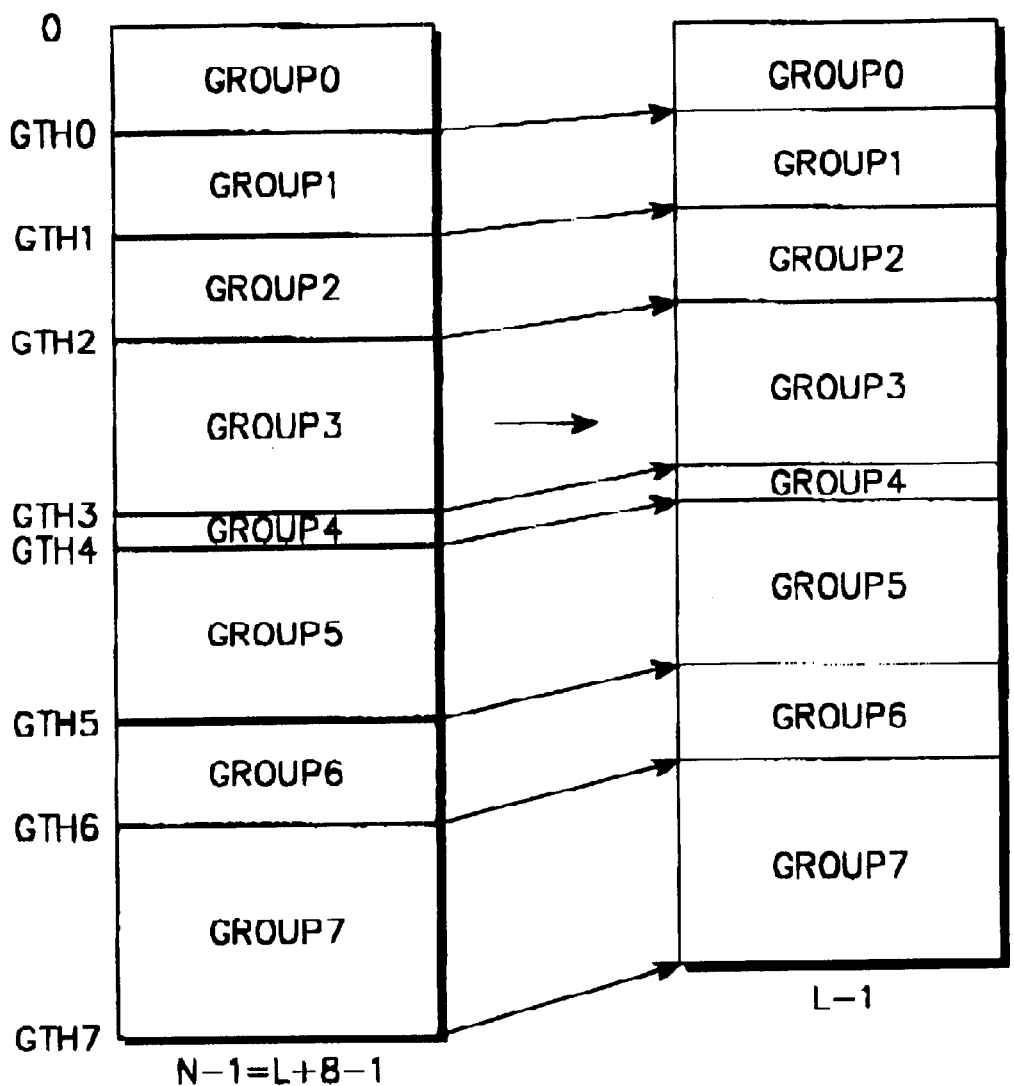
FIG. 5 is a diagram illustrating that the output data bits are connected after deleting the invalid data bits of FIG. 4.

Assume that the weight distribution of FIG. 5 is generated by calculating the generated weight of the OCPNI turbo interleaver.

TABLE 5

| Weight | 22 | 32 | 33 | 62 | 62 | 62 | 63 |
|---|---|---|---|---|---|---|---|
| Address | 44 | 92 | 8 | 76 | 111 | 124 | 56 |
| Group | 1 | 2 | 0 | 2 | 3 | 3 | 1 |

In this case, the presently required minimum distance is about 60, the initial state value of the PN generator corresponding to a group having the weight 22, 32 and 33 should be changed. That is, the initial state value of the PN generator corresponding to the groups 1, 2 and 0 should be changed. In general, since the corresponding PN generator does not affect the weight corresponding to another group, it is possible to delete the cases where the weight is lower than 60, by changing the corresponding initial state value.

In this case, assume that the initial state value of the group 1 is controlled as follows to obtain the weight distribution of Table 6.

Group 0: 0 1 0 1 0
Group 1: 1 0 1 1 1
Group 2: 0 0 1 1 0
Group 3: 1 1 0 0 1

TABLE 6

| Weight | 32 | 33 | 62 | 62 | 62 | 63 |
|---|---|---|---|---|---|---|
| Address | 92 | 8 | 76 | 111 | 124 | 56 |
| Group | 2 | 0 | 2 | 3 | 3 | 1 |

In this case, since the minimum distance is 32, an initial state value of the group 2 corresponding to the minimum distance 32 is controlled. It is possible to obtain the OCPNI turbo interleaver having the minimum distance of 62 by repeating this process. The obtained weight distribution is shown in Table 7 below.

TABLE 7

| Weight | 62 | 62 | 62 | 63 |
|---|---|---|---|---|
| Address | 76 | 111 | 124 | 56 |
| Group | 2 | 3 | 3 | 1 |

Figure 14:
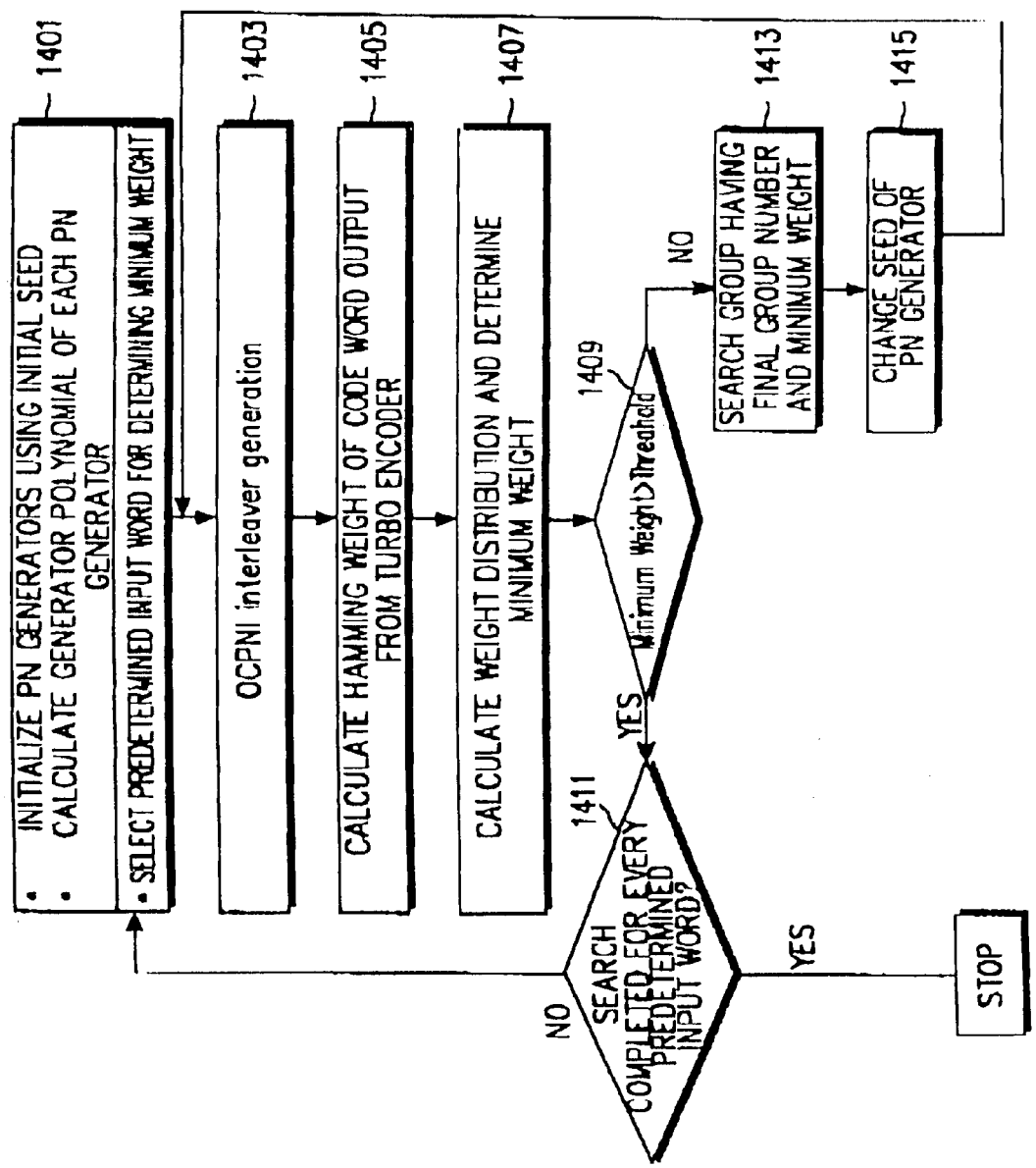
FIG. 14 is a flow chart illustrating a procedure for calculating an optimal initial state value (or seed) of the PN generators according to the second embodiment of the present invention.

FIG. 14 shows a procedure for optimizing the initial state value of the PN generators.

Referring to FIG. 14, in step 1401, the PN generator of each area is initialized using an arbitrary state value, the generator polynomial of each PN generator is determined, and then a predetermined input word for determining the minimum weight is selected. Thereafter, the OCPNI interleaver is enabled in step 1403 and a Hamming weight of the turbo encoder output from the turbo encoder is determined in step 1405. In step 1407, the weight distribution is calculated and then the minimun weight is determined. It is determined in step 1409 whether the determined minimum weight satisfies a threshold value. When the minimum weight satisfies the threshold, the procedure goes to step 1411 to determine whether the search has been performed for all the predetermined input words. When the search is completed for all the predetermined input words, the procedure is ended. Otherwise, when the search is not completed for all the predetermined input words, the procedure returns to step 1401 to select a predetermined input word for another case for determining the minimum weight and then repeats the succeeding steps. Meanwhile, when the minimum weight does not satisfy the threshold in step 409, an area having the minimum weight is searched in step 1413 and the initial state value of the PN generator corresponding to this area is charged. Thereafter, the procedure returns to step 1403 to repeat the succeeding steps. Here, the "predetermined input word" refers to a shifted information stream comprised of $2^m-1$ bits for an m-bit PN generator.

Tables 8 and 9 below show the parameters of the OCPNI according to the second embodiment of the present invention.

TABLE 8

| Rate Set 1 | | @19.2 kbps | @38.4 kbps | @76.8 kbps | @153.6 kbps | @307.2 kbps |
|---|---|---|---|---|---|---|
| interleaver Size L | | 376 | 760 | 1528 | 3064 | 6136 |
| OSV | | 8 | 8 | 8 | 8 | 8 |
| N = L + OSV | | 384 | 768 | 1536 | 3072 | 6144 |
| M | | 6 | 7 | 8 | 9 | 10 |
| $N_g$ | | 12 | 12 | 12 | 12 | 12 |
| Initial Parameter | | 11101 | 111000 | 1100101 | 01010111 | 100100110 |
| | | 00101 | 001010 | 1111001 | 01101001 | 101011010 |
| | | 11001 | 110000 | 1110101 | 01110111 | 11100110 |
| | | 11100 | 111010 | 1100001 | 01011111 | 110110110 |
| | | 00111 | 100111 | 1011011 | 00101011 | 101011110 |
| | | 10001 | 001101 | 1010100 | 00110100 | 111100000 |
| | | 10101 | 000101 | 1000100 | 00010101 | 100100010 |
| | | 11000 | 110010 | 1110001 | 01111111 | 111110110 |
| | | 00100 | 001000 | 1011110 | 01100001 | 111001010 |
| | | 00001 | 000010 | 1001010 | 00001001 | 110011010 |
| | | 11010 | 001011 | 1011000 | 00101101 | 111010110 |
| | | 01100 | 110101 | 1111111 | 01100011 | 100001110 |
| PN Generator Polynomial p(x) | | [110111] | [1011011] | [10011101] | [101100011] | [1000010001] |
| [AND]-[OR]-ring condition For $N_g$-1'th PN Generator | | [11]-[111] | [111]-[111] | [1111]-[111] | [111111]-[111] | [111111]-[111] |

In Table 8, [111]-[111] of [AND]-[OR]-ing means that PN[5:3] which is a PN generator cell of the corresponding position undergoes AND-ing and PN[2:0] undergoes OR-ing.

TABLE 9

| Rate Set 2 | | @28.8 kbps | @57.6 kbps | @115.2 kbps | @230.4 kbps | @460.8 kbps |
|---|---|---|---|---|---|---|
| Interleaver Size L | | 568 | 1144 | 2296 | 4600 | 9208 |
| OSV | | 8 | 8 | 8 | 8 | 8 |
| N = L + OSV | | 576 | 1152 | 2304 | 4608 | 9216 |
| m | | 6 | 7 | 8 | 9 | 10 |
| $N_g$ | | 18 | 18 | 18 | 18 | 18 |
| Initial Parameter | | 01100 | 100110 | 0101011 | 11110101 | 001101101 |
| | | 01001 | 011010 | 1110001 | 00111001 | 101100100 |
| | | 11111 | 000101 | 0001010 | 01010100 | 000001001 |
| | | 11111 | 101110 | 1010110 | 01000111 | 101011000 |
| | | 11111 | 111010 | 0101011 | 11010101 | 010001101 |
| | | 11100 | 001110 | 1101101 | 00111001 | 101100100 |
| | | 11100 | 100000 | 0001111 | 11001101 | 000011101 |
| | | 10000 | 010001 | 1010110 | 01000111 | 100111000 |
| | | 01110 | 011100 | 0101000 | 10010011 | 011000001 |
| | | 11111 | 000101 | 0111011 | 11010011 | 001001101 |
| | | 11100 | 010011 | 0001111 | 00000111 | 100001110 |
| | | 11001 | 010001 | 0001010 | 10100111 | 001011001 |
| | | 10010 | 000111 | 1111000 | 00101111 | 1100001000 |

TABLE 9-continued

| Rate Set 2 | @28.8 kbps | @57.6 kbps | @115.2 kbps | @230.4 kbps | @460.8 kbps |
|---|---|---|---|---|---|
|  | 11111 | 011101 | 1111110 | 10101001 | 001101101 |
|  | 01110 | 011101 | 1110001 | 00111011 | 110000110 |
|  | 11001 | 010001 | 0001111 | 00101110 | 000011101 |
|  | 11111 | 010001 | 1010110 | 01100101 | 110001000 |
|  | 01100 | 001110 | 0000100 | 11010011 | 100111111 |
| PN Generator Polynomial p(x) | [111011] | [1100111] | [11001011] | [111100111] | [110110110] |
| [AND]-[OR]-ring condition For $N_g$-1'th PN Generator | [11]-[111] | [111]-[111] | [1111]-[111] | [11111]-[111] | [111111]-[111] |

For example, when the interleaver size is L=376 in Table 8, the determined read addresses of the OCPNI are shown in Table 10 below.

TABLE 10

28 36 88 123 134 176 212 247 259 288 345 363 24 52 90 109 147 190 220 235
257 310 332 357 26 60 89 102 137 183 216 229 256 315 336 354 25 56 76 115
132 171 218 226 278 301 350 373 12 58 80 105 148 165 217 245 283 294 343
362 16 57 94 100 156 162 204 234 269 307 331 369 30 33 87 116 152 181 208
241 262 297 325 360 23 48 75 124 154 170 222 232 275 292 322 370 11 62 69
120 153 177 215 242 265 308 341 5 55 66 122 140 168 203 253 260 316 330
366 2 43 85 121 144 178 197 238 276 312 337 367 21 37 74 108 158 189 194
239 284 314 328 359 10 34 81 112 151 174 213 231 280 313 338 355 17 53 72
126 139 175 202 227 282 300 349 353 8 42 82 119 133 167 209 225 281 304
334 352 18 49 93 107 130 163 200 224 268 318 335 374 29 40 78 101 149 161
210 246 272 311 327 14 50 79 98 138 160 221 251 286 299 323 365 15 61 71
117 145 182 206 237 279 293 321 358 7 46 67 106 136 187 207 230 267 290
320 371 3 47 65 113 146 173 199 243 261 309 342 361 1 39 64 104 157 166 195
233 258 298 347 356 0 35 86 114 142 179 193 228 277 305 333 372 22 91 125
143 169 192 244 266 296 326 27 32 77 110 135 164 214 252 273 306 339 13 54
70 111 131 180 219 248 264 317 329 6 59 83 103 129 188 205 250 274 302 324
19 45 73 99 128 184 198 249 285 303 340 364 9 38 68 97 150 186 211 236 270
295 348 368 4 51 84 96 155 185 201 240 271 291 344 20 41 92 118 141 172 195
289 346 375 31 63 95 127 159 191 223 255 287 319 351

Tables 11A and 11B below show weight distribution of the OCPNI according to the first and second embodiments of the present invention, respectively.

TABLE 11A

Rate Set 1

| L | Weight Distribution |
|---|---|
| 376 | (1) 14 22 30 30 30 34 34 34 34 34 34 36 38 38 41 45 46 46 48 49 . . . |
|  | (2) 26 30 30 30 34 35 38 41 42 42 42 43 44 44 47 50 50 50 50 . . . |
| 760 | (1) 23 26 26 29 30 30 30 30 34 34 34 34 34 34 34 34 34 38 45 . . . |
|  | (2) 50 52 52 58 59 61 63 69 70 71 78 78 78 78 78 78 78 78 78 . . . |
| 1528 | (1) 34 34 34 34 34 34 34 34 34 34 40 46 50 54 54 58 58 58 58 58 . . . |
|  | (2) 57 57 58 58 58 58 58 58 58 58 58 58 58 60 64 74 74 77 78 78 . . . |
| 3064 | (1) 26 30 34 34 34 34 34 34 34 34 34 34 34 34 34 34 34 34 54 . . . |
|  | (2) 58 58 58 58 58 58 58 58 58 58 58 58 58 58 58 69 78 98 98 . . . |
| 6136 | (1) 34 34 34 34 34 34 34 34 34 34 34 34 34 34 34 34 34 51 58 58 . . . |
|  | (2) 106 106 106 106 106 106 106 106 106 106 106 106 106 106 106 . . . |

TABLE 11B

Rate Set 2

| L | Weight Distribution |
|---|---|
| 568 | (1) 26 26 30 30 30 30 34 41 43 46 46 46 46 46 46 46 46 46 46 . . . |
|  | (2) 77 82 82 82 87 88 90 94 97 100 100 101 102 102 102 . . . |
| 1144 | (1) 21 30 30 30 30 46 46 46 46 46 46 46 46 46 46 50 . . . |
|  | (2) 97 10 102 102 102 102 102 102 102 102 102 102 102 . . . |
| 2296 | (1) 30 34 45 46 46 46 46 46 46 46 46 46 46 46 46 46 . . . |
|  | (2) 107 112 116 119 121 122 127 131 132 135 139 140 . . . |
| 4600 | (1) 46 46 46 46 46 46 46 46 46 46 46 46 46 46 46 46 . . . |
|  | (2) 154 154 154 154 154 154 154 154 154 154 154 154 174 . . . |
| 9208 | (1) 46 46 46 46 46 46 46 46 46 46 46 46 46 46 46 46 . . . |
|  | (2) 174 220 226 226 226 226 226 226 226 226 226 226 226 . . . |

It can be appreciated from Table 8 that the OCPNI according to the second embodiment has twice the performance in weight distribution than the OCPNI according to the first embodiment.

In conclusion, performance of the OCPNI is greatly affected by the group number $N_g$ and is also related to the primitive polynomial. The excessive high $N_g$ causes a decrease in each group size, which deteriorates the random property. Therefore, it is necessary to determine a proper $N_g$. For example, when $N_g$=FL, there is provided performance of an OCI (Offset Controlled Interleaver) which has inferior performance as compared to the OCPNI. The final object to be considered is to search for an optimal initial state value from the $N_g$ and primitive polynomial.

The foregoing description has been made with reference to the CDMA-2000 system. For example, when the OCPNI according to the present invention is applied to a turbo interleaver for the UNTS system, the following parameters can be obtained. Tables 12 and 13 below show the parameters for obtaining the best performance.

TABLE 12

| interleaver Size L | 320 | 640 | 1280 | 2560 | 3840 | 5120 |
|---|---|---|---|---|---|---|
| OSV | 0 | 0 | 0 | 0 | 0 | 0 |
| N = L + OSV | 320 | 640 | 1280 | 2560 | 3840 | 5120 |
| M | 5 | 6 | 7 | 7 | 8 | 8 |
| $N_g$ | 10 | 10 | 10 | 20 | 15 | 20 |
| See for PN generator | 01100 | 010100 | 1000100 | 1010001 | 00100110 | 00100110 |
|  | 11001 | 001010 | 1110111 | 0011000 | 01101000 | 01101000 |
|  | 01100 | 010100 | 1111101 | 1010001 | 10100111 | 10100111 |
|  | 10000 | 001010 | 0000111 | 0100010 | 01001001 | 10011010 |
|  | 01100 | 011001 | 1111101 | 1001011 | 11100100 | 10100100 |
|  | 00110 | 100101 | 1000100 | 1001011 | 01100000 | 01000000 |
|  | 01010 | 000001 | 1001101 | 1001011 | 11000110 | 11000110 |
|  | 00011 | 110011 | 1010001 | 0101110 | 00111010 | 00111010 |
|  | 01100 | 110100 | 1000100 | 0011100 | 10110010 | 10010010 |
|  | 00001 | 110011 | 1101001 | 0001110 | 00101010 | 10111001 |
|  |  |  |  | 0001110 | 10111001 | 01000010 |
|  |  |  |  | 1100010 | 00010101 | 01110101 |
|  |  |  |  | 0001100 | 01101000 | 00011100 |
|  |  |  |  | 1010011 | 01000000 | 01000000 |
|  |  |  |  | 0100010 | 10001000 | 11011000 |
|  |  |  |  | 0101111 |  | 11010111 |
|  |  |  |  | 0101110 |  | 00011010 |
|  |  |  |  | 0101100 |  | 10010111 |
|  |  |  |  | 0101111 |  | 00101111 |
|  |  |  |  | 0011110 |  | 01110100 |
| PN generator p(x) | 111011 | 1011011 | 11001011 | 11001011 | 1110011 | 111100111 |

TABLE 13

| interleaver Size L | 320 | 320 | 640 | 640 | 1280 | 2560 | 5120 |
|---|---|---|---|---|---|---|---|
| OSV | 0 | 0 | 0 | 0 | 0 | 0 | 0 |
| N = L + OSV | 320 | 320 | 640 | 640 | 1280 | 1280 | 5120 |
| m | 6 | 4 | 7 | 5 | 6 | 8 | 9 |
| $N_g$ | 5 | 20 | 5 | 20 | 20 | 10 | 10 |
| Seed for PN generator | 111101 | 1011 | 0001010 | 01011 | 010110 | 11101110 | 110001101 |
|  | 110100 | 1011 | 0011110 | 00101 | 111001 | 01101000 | 111100110 |
|  | 011001 | 1111 | 10001101 | 10100 | 001100 | 10000100 | 101011001 |
|  | 110011 | 1001 | 1000011 | 01111 | 111111 | 10010110 | 011010011 |
|  | 110100 | 1011 | 1010110 | 01111 | 011100 | 01001110 | 101101010 |

TABLE 13-continued

|  |  |  |  |  |  |  |  |
|---|---|---|---|---|---|---|---|
|  |  | 1011 |  | 01111 | 101001 | 11001101 | 001101101 |
|  |  | 1011 |  | 01111 | 111010 | 01011001 | 000100010 |
|  |  | 1011 |  | 01010 | 011010 | 10101100 | 101000100 |
|  |  | 0001 |  | 00101 | 111010 | 10010101 | 101110011 |
|  |  | 1001 |  | 00001 | 000101 | 00001101 | 110101100 |
|  |  | 0110 |  | 11110 | 101011 |  |  |
|  |  | 0111 |  | 10011 | 111000 |  |  |
|  |  | 0100 |  | 01101 | 010010 |  |  |
|  |  | 0111 |  | 00111 | 010000 |  |  |
|  |  | 1011 |  | 10100 | 011111 |  |  |
|  |  | 0010 |  | 01010 | 100100 |  |  |
|  |  | 1011 |  | 00101 | 010100 |  |  |
|  |  | 0010 |  | 11110 | 000100 |  |  |
|  |  | 1010 |  | 01101 | 011111 |  |  |
|  |  | 0001 |  | 10001 | 11000 |  |  |
| PN generator p(x) | 1011011 | 11001 | 11001011 | 110111 | 1011011 | 111100111 | 1101101101 |

Table 14 below shows the weight distribution occurring when the above parameters are used.

TABLE 14

| interleaver Size | Minimum Weight/$N_g$ (-> number of group) |
|---|---|
| 320 | 48/5, 50/10, 36/20 |
| 640 | 50/5, 78/10, 78/10 |
| 1280 | 90/10, 74/20 |
| 2560 | 90/10, 102/20 |
| 3840 | 130/15 |
| 5120 | 130/10, 170/20 |

As described above, the turbo interleaver for the UMTS system does not add the offset value since all the frame sizes can be divided by $2^m$. However, the UMTS specification has not yet given any definition to the frame size to be actually used. In other words, the above frame sizes are set for verification. Therefore, when the frame size is actually determined, the offset value OSV should be added according to the principle of the invention.

As described above, the novel method minimizes the memory capacity required for random interleaving while satisfying the random property, distance property and weight property during interleaving of the input data. Further, the proposed offset controlled interleaving method can solve the problem of the existing PN interleaving method wherein the interleaver size cannot be expressed in terms of the power of 2 and the large interleaver size decreases the memory utilization efficiency. In addition, when the interleaver size of each logical channel is not expressed in terms of the power of 2 in designing an interleaver for the IMT-2000 system, the interleaver size is very large. The present invention provides a method for solving this problem. Further, in the existing interleaving method, since the interleaving rule according to the respective interleaver sizes should be stored in a controller (CPU or host) of the transceiver, a separate storage area is required in the CPU memory in addition to the interleaver buffer. The present invention has solved this problem. That is, the hardware complexity is reduced by implementing an interleaver which can perform enumeration. In addition, the interleaver/deinterleaver transmission method for transmission/reception is very simple and uses the minimum memory capacity. That is, an interleaver memory capacity corresponding to the frame(interleaver) size L is required. Finally, the novel interleaver satisfies all the properties of the turbo interleaver and is similar or superior in performance to the random interleaver. Therefore, the novel interleaver guarantees an average performance or better.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A device for generating L addresses, which are smaller in number than $2^m \times N_g$ virtual addresses, for reading data from an interleaver memory in which L data bits are stored, the device comprising:

a selection circuit including $N_g$ PN (Pseudo Noise) generators each including m memories, wherein one of the PN generators generates (OSV−1) offset values (OSV) satisfying $OSV = 2^m \times N_g - L$ and ($2^m$−OSV) non-zero states in response to a first clock signal, and the other PN generators each generate ($2^m$−1) non-zero states, wherein the selection circuit periodically selects the PN generators according to a predetermined order in response to a select signal and outputs a state generated from the selected PN generator;

means for detecting each offset state from one PN generator, providing said select signal for not selecting said one PN generator so that the detected offset state is not output, and generating high address bits related to each selection of the PN generators in response to clock pulses of a second clock signal having a shorter period than the first clock signal;

means for generating low address bits determined by subtracting one from each state output from the selection circuit when a number of selection periods of the PN generators is smaller than $2^m$, and generating low address bits corresponding to $2^m$−1 when the number of selection periods is $2^m$; and an address buffer for storing the addresses, said L addresses each being comprised of the high address bits and the low address bits.

2. The device as claimed in claim 1, wherein the OSV is a minimum value which is added such that when a size of the input data is converted to a binary value, a number of consecutive zero bits from the least significant bit (LSB) is at least one.

3. The device as claimed in claim 1, wherein the selection circuit generates a select signal for sequentially selecting the PN generators.

4. The device as claimed in claim 1, wherein the selection circuit generates a select signal for randomly selecting the PN generators.

5. The device as claimed in claim 1, wherein an initial state value of the PN generators is set to a state value satisfied by comparing a minimum weight determined by turbo encoding a predetermined input word for every case with a predetermined threshold value.

6. A device for generating L addresses, which are smaller in number than $2^m \times N_g$ virtual addresses, for reading data from an interleaver memory in which L data bits are stored, the device comprising:

is $N_g$ PN generators each including m memories;

an address generator for adding an offset value to the input data size to provide a virtual address having a size of a multiple of $2^m$, and generating addresses other than addresses corresponding to the offset value in address generation areas using the address generation areas having the size of $2^m$; and means for reading the input data from the interleaver memory using random addresses generated from the address generation areas.

7. The device as claimed in claim 6, wherein the address generator comprises:

a selection circuit including said $N_g$ PN (Pseudo Noise) generators, wherein one of the PN generators generates (OSV−1) offset values satisfying $OSV=2^m \times N_g -L$ and ($2^m$−OSV) non-zero states in response to a first clock signal and the other PN generators each generate ($2^m$−1) non-zero states, wherein the selection circuit selects the PN generators according to a predetermined order in response to a select signal and outputs a state generated from the selected PN generator;

means for detecting each offset state from one PN generator, providing said select signal for not selecting said one PN generator so that the detected offset state is not output, and generating high address bits related to each selection of the PN generators in response to clock pulses of a second clock signal having a shorter period than the first clock signal;

means for generating low address bits determined by subtracting one from each state output from the selection circuit when a number of selection periods of the PN generators is smaller than $2^m$, and generating low address bits corresponding to $2^m-1$ when the number of selection periods is $2^m$; and an address buffer for storing the addresses, said L addresses each being comprised of the high address bits and the low address bits.

8. The device as claimed in claim 7, wherein the OSV is a minimum value which is added such that when a size of the input data is converted to a binary value, a number of consecutive zero bits from the least significant bit (LSB) is at least one.

9. The device as claimed in claim 7, wherein the selection circuit generates a select signal for sequentially selecting the PN generators.

10. The device as claimed in claim 7, wherein the selection circuit generates a select signal for randomly selecting the PN generators.

11. The device as claimed in claim 7, wherein an initial state value of the PN generators is set to a state value satisfied by comparing a minimum weight determined by turbo encoding a predetermined input word for every case with a predetermined threshold value.

12. A method for generating L addresses, which are smaller in number than $2^m \times N_g$ virtual addresses, for reading data from an interleaver memory in which L data bits are stored, the method comprising the steps of:

generating, in one of $N_g$ PN generators, (OSV−1) offset values (OSV) satisfying $OSV=2^m \times N_g -L$ and ($2^m$−OSV) non-zero states;

generating, in each of the other PN generators, ($2^m$−1) non-zero states;

detecting each offset state from said one PN generator, and generating a select signal having a selection period for skipping selection of said one PN generator in a predetermined selection order for the PN generators so that the detected offset state is not selected;

selecting the PN generators according to the select signal and sequentially generating the non-zero states;

subtracting one from the non-zero states;

providing the subtracted states as low address bits when a number of the selection periods is smaller than $2^m$, providing low address bits corresponding to $2^m-1$ states when the number of the selection periods is $2^m$, and generating high address bits associated with the select signal related to the low address bits; and reading the L data bits from the interleaver memory using the addresses comprised of the low address bits and the high address bits.

13. The method as claimed in claim 12, wherein the OSV is a minimum value which is added such that when a size of the input data is converted to a binary value, a number of consecutive zero bits from the least significant bit (LSB) is at least one.

14. The method as claimed in claim 12, wherein said predetermined selection order is an order of sequentially selecting the PN generators.

15. The method as claimed in claim 12, wherein said predetermined selection order is an order of randomly selecting the PN generators.

16. The method as claimed in claim 12, wherein an initial state value of the PN generators is set to a state value satisfied by comparing a minimum weight determined by turbo encoding an predetermined input word for every case with a predetermined threshold value.

17. A method for interleaving input data having an input data size which is not a multiple of $2^m$ (m>1), the method comprising the steps of:

sequentially storing the input data in a memory;

adding an offset value to the input data size to provide a virtual address size, which is a multiple ($N_g$) of $2^m$;

providing $N_g$ address generation areas each having a size of $2^m$, and generating addresses other than addresses corresponding to the offset value in the address generation areas; and reading the input data from the memory using the addresses generated from the address generation areas.

18. The method as claimed in claim 17, wherein the address generating step comprises the steps of:

generating, in one of PN generators corresponding to the address generation areas, ($2^m$−1) non-zero states including offset states corresponding to the offset value (OSV);

generating, in each of the other PN generators, ($2^m$−1) non-zero states;

detecting each offset state from said one PN generator, and selecting the non-zero states from the PN generators according to a select signal having a selection period for skipping selection of said one PN generator in a predetermined selection order for the PN generators;

subtracting one from the selected states to provide the subtracted states as low address bits, and generating high address bits associated with the select signal related to the low address bits; and generating the addresses comprised of the low address bits and the high address bits.

19. The method as claimed in claim 18, wherein the high address generating step comprises the steps of:

provide the subtracted states as the low address bits when a number of the selection periods is smaller than $2^m$;

providing the low address bits corresponding to $2^m-1$ states when the number of the selection periods is $2^m$; and generating the high address bits associated with the select signal related to the low address bits.

20. The method as claimed in claim 18, wherein the OSV is a minimum value which is added such that when a size of the input data is converted to a binary value, a number of consecutive zero bits from the least significant bit (LSB) is at least one.

21. The method as claimed in claim 18, said predetermined selection order is an order of sequentially selecting the PN generators.

22. The method as claimed in claim 18, wherein said predetermined selection order is an order of randomly selecting the PN generators.

23. The method as claimed in claim 18, wherein an initial state value of the PN generators is set to a state value satisfied by comparing a minimum weight determined by turbo encoding an predetermined input word for every case with a predetermined threshold value.

24. A turbo encoding device comprising:

a first component encoder for encoding input data having a size which is not a multiple of $2^m$ (m>1);

an interleaver for sequentially storing the input data in an interleaver memory, for adding an offset value to the input data size to provide a virtual address size, said virtual address size being a multiple ($N_g$) of $2^m$, for providing $N_g$ address generation areas each having a size of $2^m$, for generating addresses other than addresses corresponding to the offset value in the address generation areas, and for reading the input data from the interleaver memory using the generated addresses; and a second component encoder for encoding the data read from the interleaver memory.

* * * * *